US006308140B1

(12) United States Patent
Dowling et al.

(10) Patent No.: US 6,308,140 B1
(45) Date of Patent: Oct. 23, 2001

(54) MOTOR CONDITION AND PERFORMANCE ANALYZER

(75) Inventors: Martin Joseph Dowling, Norristown; George Fox Lang, Lansdale; Binish Praful Desai, Norristown; Louis Ricciuti, Jr., Darby, all of PA (US)

(73) Assignee: Crane Nuclear, Inc., Kennesaw, GA (US)

( * ) Notice: Subject to any disclaimer, the term of this patent is extended or adjusted under 35 U.S.C. 154(b) by 0 days.

(21) Appl. No.: 09/587,827

(22) Filed: Jun. 6, 2000

Related U.S. Application Data

(63) Continuation of application No. 08/650,228, filed on May 20, 1996.
(51) Int. Cl.[7] .................................................... G06F 19/00
(52) U.S. Cl. ............................................. 702/60; 324/772
(58) Field of Search ................................. 702/58, 60, 59, 702/33, 34, 35, 36; 318/254, 806; 324/772

(56) References Cited

U.S. PATENT DOCUMENTS

| | | | |
|---|---|---|---|
| 4,450,398 | 5/1984 | Bose ........................................ | 318/803 |
| 4,735,101 | 4/1988 | Charbonneau et al. ........... | 73/862.32 |

(List continued on next page.)

OTHER PUBLICATIONS

IEEE Standard Test Procedure for Polyphase Induction Motors 112–1991, p. 1–35.
Umans, "AC Induction Motor Efficiency" p. 99–107, (no date).
John S. Hsu et al., Fild Assessment of Induction Motor Efficiency Through Air–Gap Torque, 96 WM 130–5 EC, pp. 1–6; Presented at the 1996 IEEE/PES Winter Meeting, Jan. 21–25, 1996.
"Conference Record of the 1989 IEEE Industry Applications Society Annual Meeting Part II", Papers Presented at the 1989 Industry Applications Conference Twenty–Fourth 1AS Annual Meeting, Oct. 1–5, 1989, Sponsored by the IEEE Industry Applications Society.
"Current Practices and Trends in Mechanical Failure Prevention", Proceedings of the 44th Meeting of the Mechanical Failures Prevention Group, Apr. 3–5, 1990, compiled by Henry C. Pusey and Sallie C. Pusey, a publication of the *Vibration Institute*.
IEEE Standard Test Procedure for Polyphase Induction Motors and Generators, IEEE Std 112–1996 (Revision of IEEE Std 112–1991).
Lawrie, Robert J. "Voltage Unbalance Shorten Motor Life and Wastes Energy" ECM Electrical Construction & Maintenance v90, n11, p20(2); Nov. 1991.
Keefover, Marvin D. "Reducing Electric Utility Costs" EC&M Electrical Construction & Maintenance v92 n8 p53(5) (no date).
Nailen, "Can Field Tests Prove Motor Efficiency" IEEE Transactions on Industry Applications vol. 25 No. 3, May/Jun. 1989, pp. 391–396.
Kliman et al., "Noninvasive Detection of Broken Rotor Bars in Operating Induction Motors", IEEE, 1988.*

(List continued on next page.)

*Primary Examiner*—Patrick Assouad
(74) *Attorney, Agent, or Firm*—Womble Carlyle Sandridge & Rice

(57) ABSTRACT

A method of detecting broken rotor bars including sensing currents applied to the motor, converting the senses signals to digital data signals, and storing the digital data signals. A processor evaluates the digital data to provide a current signal spectrum at various selected sidebands. Sideband peaks having an amplitude within a predetermined value are identified, indicating potential motor problems or developing problems, including winding faults and broken rotor bars. Advanced signal processing techniques are used to further evaluate stored data and to provide trending information.

3 Claims, 18 Drawing Sheets

U.S. PATENT DOCUMENTS

| | | | |
|---|---|---|---|
| 4,793,186 | 12/1988 | Hurley | 73/650 |
| 4,860,596 | 8/1989 | Charbonneau et al. | 73/862.32 |
| 4,869,102 | 9/1989 | Hale et al. | 73/168 |
| 4,891,975 | 1/1990 | Charbonneau et al. | 73/168 |
| 5,000,040 | 3/1991 | Charbonneau et al. | 73/168 |
| 5,152,172 | 10/1992 | Leon et al. | 73/579 |
| 5,239,874 | 8/1993 | Hale | 73/862.191 |
| 5,270,640 | 12/1993 | Kohler et al. . | |
| 5,396,167 | 3/1995 | Leon | 324/73.1 |
| 5,430,368 | 7/1995 | Leon | 324/73.1 |
| 5,432,436 | 7/1995 | Leon et al. | 324/73.1 |
| 5,475,299 | 12/1995 | Leon | 324/73.1 |
| 5,514,978 | 5/1996 | Koegl et al. . | |
| 5,519,300 | 5/1996 | Leon et al. | 318/729 |
| 5,519,337 * | 5/1996 | Casada | 324/772 |
| 5,521,482 | 5/1996 | Lang et al. | 318/800 |
| 5,523,701 * | 6/1996 | Smith et al. | 324/772 |
| 5,530,343 * | 6/1996 | Bowers, III et al. | 324/173 |
| 5,661,386 | 8/1997 | Kueck et al. | 318/490 |
| 5,680,025 * | 10/1997 | Bowers, III et al. | 318/806 |
| 5,739,698 * | 4/1998 | Bowers et al. | 324/772 |
| 5,742,522 * | 4/1998 | Yazici et al. | 364/551.01 |
| 6,128,583 * | 10/2000 | Dowling | 702/58 |
| 6,144,924 * | 11/2000 | Dowling et al. | 702/60 |

OTHER PUBLICATIONS

Walliser et al., "Determination of Interbar Current Effects in the Detection of Broken Rotor Bars in Squirrel Cage Induction Motors", IEEE, 1993.*

Burnett et al., "The Current Analysis Program—A Software Tool for Rotor Fault Detection in Three Phase Induction Motors", IEE, 1995.*

Burnett et al., "The Application of Modern Signal Processing Techniques to Rotor Fault Detection and Location within Three Phase Induction Motors", IEEE, 1995.*

Penman et al., "Broken rotor bars: their effect on the transient performance of induction machines", IEEE, 1996.*

Elder et al., "Fault Detection in Induction Motors as a Result of Transient Analysis", IEEE, unknown date.*

Thomson et al., "On–Line Current Monitoring for Fault Diagnosis in Inverter Fed Induction Motors", IEEE, unknown date.*

Hsu, "An Approximate Model for Studying Harmonic Current Amplications in Current–Source Inverter Fed Induction Motors", IEEE, 1992.*

* cited by examiner

```
Line Frequency (Hz)    60.0
        Power (KW)     11.2
        Power Factor   0.785

Voltage  (RMS)    Distortion (%)    CREST
Vab      473.3       0.63           1.42
Vbc      473.9       0.57           1.41
Vca      472.2       0.67           1.41
Mean     473.2    Unbalance (%)     0.35

Amperes  (RMS)    Distortion (%)    CREST
Ia       17.54       1.5            1.44
Ib       17.71       1.9            1.44
Ic       17.22       1.3            1.44
Mean     17.49    Unbalance (%)     2.8
```

```
Shaft Speed (RPM)    1762
Slip (%)             2.06
Output (HP)          13
Torque (Lb-Ft)       19
Efficiency (%)       87
Rated Load (%)       87

System Voltage       Normal
Motor Current        Normal
Motor Loading        Normal
Performance          Normal
Rotor Condition      Normal
Stator Condition     Normal Aux Alarm #1         Normal
Aux Alarm #2         Normal
```

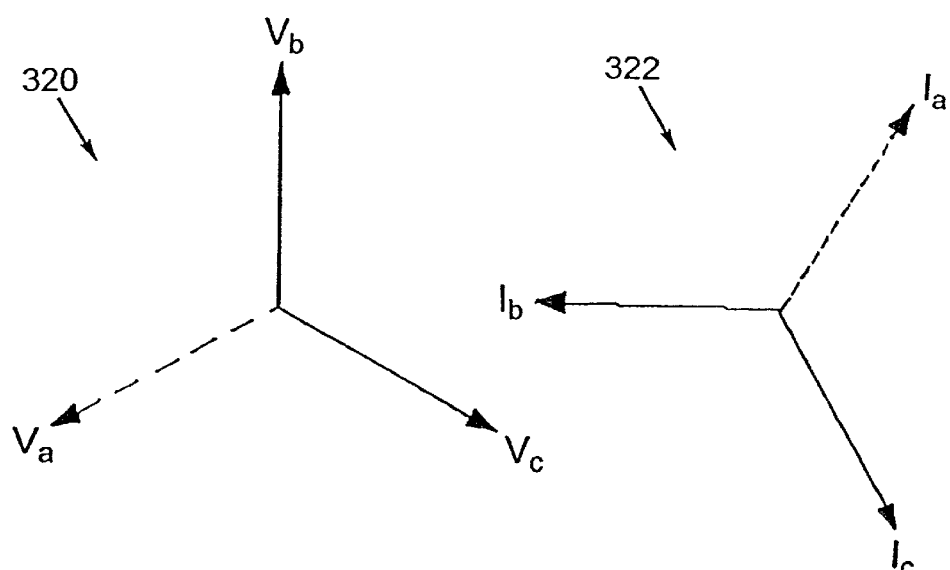
FIG. 16 *(Prior Art)*
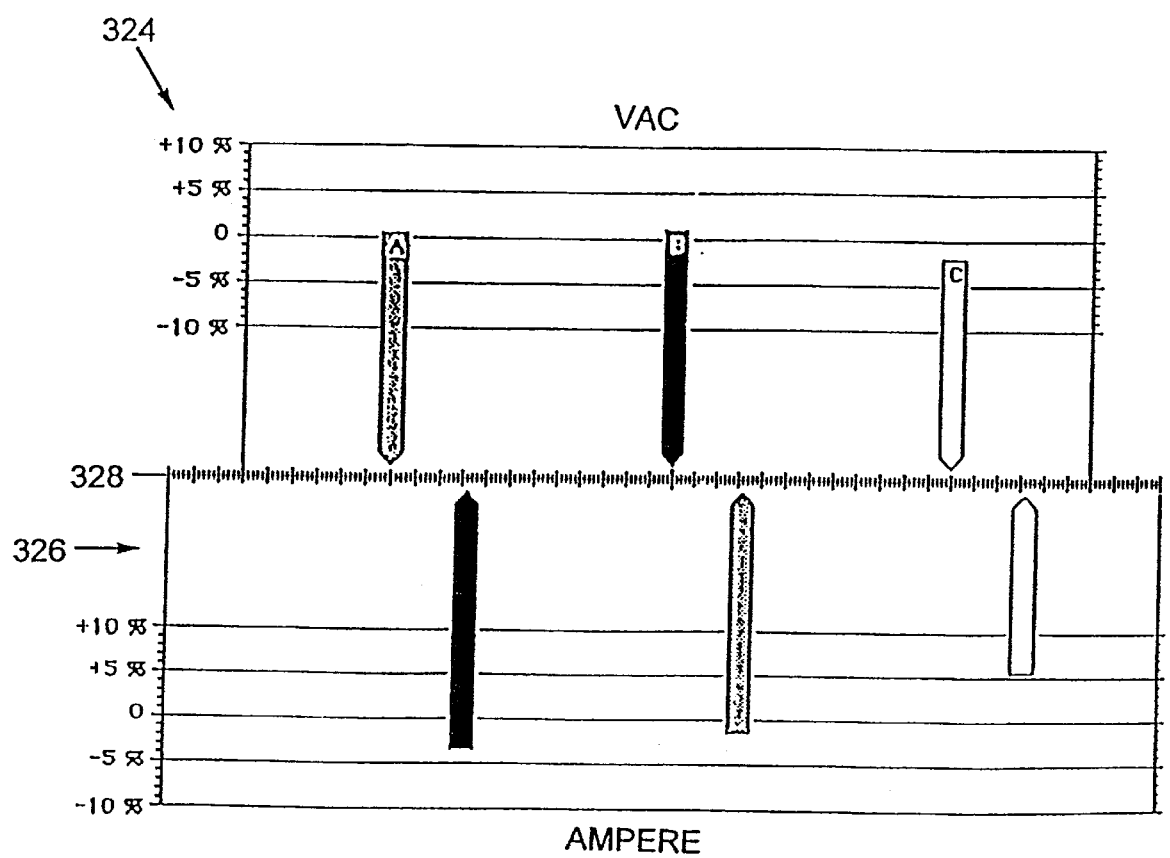
FIG. 17

MOTOR CONDITION AND PERFORMANCE ANALYZER

This application is a continuation of Ser. No. 08/650,228 filed May 20, 1996.

FIELD OF THE INVENTION

The present invention generally pertains to a device and method for evaluating and reporting motor condition and performance and more particularly, to an improved method and apparatus for evaluating motor performance and assessing motor condition while the motor is operating.

BACKGROUND OF THE INVENTION

Motors, particularly electrical motors, play a key role in industry. Such motors are used to drive fans, pumps, compressors, valves, and many other machines. It is potentially very costly to allow a significant problem to go on unnoticed in either the motor or the motor driven machine. It is also costly and very time consuming to attempt to repair a nonexistent problem. With present methods of analyzing motor performance, these costly situations often occur. Thus there is a need for an improved diagnostic method and apparatus for use with motors and motor driven machines.

Prior art motor monitors do not report exact shaft speed, comprehensive motor condition, or efficiency of a continuously running motor without the use of intrusive sensors. Such prior art monitors also do not provide automatic probe misplacement detection and correction, nor do they statistically analyze data on a per load basis, to provide a meaningful view.

Prior art motor monitors also have serious deficiencies in measuring the exact speed of an electric motor. Generally, the motor shaft speed is measured in one of several ways, all of which are very inconvenient to a user. One method of measuring shaft speed is to use a tachometer attached to a shaft of the motor. This requires a mechanical connection which, in turn, mandates shutting the motor down. Alternatively, a reflective tape or a notch can be placed on the shaft to provide a once-per-revolution phase reference and speed indicator. However, in addition to requiring a motor shut down, the speed accuracy is limited because the timing sample occurs only once per shaft revolution. Another method of determining shaft speed is to calibrate the motor driver to measure shaft speed based on load and torque. This is an indirect measurement, requires software specialized to the particular motor and drive, and is only suitable for use on a very small number of motors.

Prior art motor monitors for detecting winding faults require the use of coils intrusively placed within the motor, or alternately, monitoring the neutral return line for radio frequency evidence of arcing. These monitors require extra hardware beyond the normally used three current and three voltage probes. Additionally, in most motors the neutral wire is unavailable. Accordingly, to implement comprehensive detection, all three electrical leads have to be monitored with high frequency probes in addition to the usual power frequency probes. This involves multiple additional sensors and channels, high frequency sensors, and extra signal conditioning.

Prior art motor monitors for detecting broken rotor bars generally search for sidebands of the first harmonic of the synchronous frequency for detecting broken rotor bars. This method of detection is not totally reliable because torque variations in the load as well as the use of certain external equipment give rise to interfering sidebands. For example, the use of belt drives can produce such interfering tones. Also, air gap asymmetries between the rotor and stator can give rise to artifactual tones in that region of the spectrum.

Another shortcoming of prior art motor monitors is the need to take the motor off-line in order to ascertain resistive and inductive unbalance. This is a great inconvenience when dealing with continuous-duty motors. In addition, the off-line measurements may not be truly representative of the on-line resistive or inductive balance, since operational stresses may significantly change the state of balance. Further, prior art motor monitors for measuring efficiency require a dynamometer to measure the load.

The present invention provides a motor monitor which measures a motor's efficiency without the requirement of a dynamometer. In addition, the present invention performs two unique functions which improve the efficiency measurement: (a) correcting for unbalance in the power source voltage; and (b) compensating for line loss. The present invention provides a probe configuration for obtaining motor data and a processor for analyzing the motor data. A memory is included for storing motor data (e.g., in a database), which allows for comparisons to be made between the motor's present condition and performance and motor historical data to determine the presence of trends, and data on similar "sister" motors to ascertain normality with respect to a population of similar motors. The database accumulates knowledge about the motor, which may be sorted by load. The information provided by the present invention is useful for changing operating load, scheduling maintenance, planning for replacement, or even shutting down, as is appropriate. Furthermore, the system compares multiple motors under similar operating conditions so that comparisons can be made, which are useful, for instance, in making purchasing decisions.

The present invention determines shaft speed, condition, and performance of a three phase induction motor, and more specifically measures the exact shaft speed, detects stator winding shorts, detects broken rotor bars, and measures output and efficiency using only current and voltage measurements, in conjunction with a knowledge of approximate shaft speed, motor resistance, and historical electrical data from the same motor under an uncoupled condition. In addition, the present invention provides features of great convenience to a user which prior art systems do not offer, such as automatic probe check and software correction for misplaced probes.

The present invention can be used to provide either on-line continuous monitoring of condition and performance, or as a periodic inspection tool. The present invention also provides detailed analysis capability for intensive diagnostic work and a database for determining trends and relative performance (compared to similar motors). The present invention avoids the limitations and problems with the prior art by providing new, meaningful representations of the data, comparing results with historical data and sister motors and by providing on-line monitoring or periodic inspection functions, as well as automatic probe misplacement detection and correction. Algorithms are implemented to precisely determine motor speed, winding faults, and broken rotor bars from nonintrusive current measurement, and to determine efficiency without a dynamometer, by using a reasonable generic estimate of minor motor losses, in conjunction with prior uncoupled motor data.

SUMMARY OF THE INVENTION

Briefly stated, the present invention comprises a first method of evaluating performance of a polyphase induction motor, the motor including a number of pole pairs, by using an electrical signature of the motor, comprising the steps of:

sensing an instantaneous current signal supplied to the motor as a function of time for a period of time for at least one electrical phase of the motor;

generating a Fourier transform on the sensed current signal over at least a portion of the period of time to provide a current signal spectra;

locating a maximum frequency peak in a predetermined shaft sideband frequency range of the current signal spectra;

locating a frequency peak indicative of line frequency from the current signal spectra; and determining a shaft speed of the motor from a difference between the located shaft sideband frequency maximum peak and the located line frequency peak, taking into account the number of pole pairs of the motor.

The present invention includes a second method of evaluating performance of a polyphase induction motor, the motor including a number of pole pairs, by using an electrical signature of the motor, comprising the steps of:

sensing an instantaneous current signal supplied to the motor as a function of time for a period of time for at least one electrical phase of the motor;

generating a Fourier transform on the sensed current signal over at least a portion of the period of time to provide a current signal spectra;

locating a maximum peak in a predetermined pole-pass sideband frequency range of the current signal spectra;

locating a peak indicative of line frequency from the current signal spectra; and determining a shaft speed of the motor from a difference between the located pole-pass sideband frequency maximum peak and the located line frequency peak, taking into account the number of pole pairs of the motor.

The present invention also includes a third method of evaluating performance of a polyphase induction motor, the motor including a number of pole pairs, using an electrical signature of the motor, comprising the steps of:

sensing an instantaneous current signal supplied to the motor as a function of time for a period of time for at least one electrical phase of the motor;

amplitude demodulating the sensed current signal to provide an amplitude demodulated current signal as a function of time for the at least one electrical phase of the motor;

generating a Fourier transform on the amplitude demodulated current signal to provide a current signal spectra;

locating a maximum peak in a predetermined shaft frequency range of the current signal spectra; and determining a shaft speed of the motor from the located shaft frequency maximum peak, taking into account the number of pole pairs of the motor.

The present invention includes yet a fourth method of evaluating performance of a polyphase induction motor, the motor including a number of pole pairs, by using an electrical signature of the motor, comprising the steps of:

sensing an instantaneous current signal supplied to the motor as a function of time for a period of time for at least one electrical phase of the motor;

amplitude demodulating the sensed current signal to provide an amplitude demodulated current signal as a function of time for the at least one electrical phase of the motor;

generating a Fourier transform on the amplitude demodulated current signal to provide a current signal spectra;

locating a maximum peak in a predetermined pole-pass frequency range of the current signal spectra; and determining a shaft speed of the motor from the located pole-pass frequency maximum peak, taking into account the number of pole pairs of the motor.

The present invention includes a fifth method of evaluating performance of a polyphase induction motor, the motor including a number of pole pairs, by using an electrical signature of the motor, comprising the steps of:

simultaneously sensing an instantaneous current signal supplied to the motor as a function of time for three electrical phases of the motor;

simultaneously sensing an instantaneous voltage supplied to the motor as a function of time for three electrical phases of the motor;

calculating a negative sequence reactance and a negative sequence resistance from the measured voltages and currents;

determining a ratio between the negative sequence reactance and the negative sequence resistance; and comparing the ratio to a predetermined value whereby a predetermined difference between the ratio and the predetermined value is indicative of a stator winding fault.

The present invention also includes a sixth method of evaluating performance of a polyphase induction motor, the motor including a number of pole pairs, by using an electrical signature of the motor, comprising the steps of:

simultaneously sensing an instantaneous current signal supplied to the motor as a function of time over a period of time for three electrical phases of the motor;

simultaneously sensing an instantaneous voltage supplied to the motor as a function of time over the period of time for three electrical phases of the motor;

calculating a negative sequence reactance and a negative sequence resistance from the measured voltages and currents; and analyzing changes in the negative sequence resistance or the negative sequence reactance in order to detect a stator winding fault; and measuring a load parameter of the motor over the period of time and wherein comparisons between negative sequence reactances and comparisons between negative sequence resistances are made with like load parameter levels.

The present invention further includes a method of detecting motor winding faults of a polyphase induction motor, the motor including a number of pole pairs, by using an electrical signature of the motor, comprising the steps of:

simultaneously sensing an instantaneous current signal supplied to the motor as a function of time over a period of time for three electrical phases of the motor;

simultaneously sensing an instantaneous voltage supplied to the motor as a function of time over the period of time for three electrical phases of the motor;

calculating current unbalance using the sensed current signals;

calculating voltage unbalance using the sensed voltage signals;

determining a winding unbalance as a difference between the current unbalance and the voltage unbalance, thereby removing an effect of any source unbalance; and comparing the winding unbalance with a predetermined value to thereby detect a motor winding fault.

The present invention also includes a method of identifying a stator fault in a polyphase induction motor, the motor including a number of pole pairs, by using an electrical signature of the motor, comprising the steps of:

simultaneously sensing an instantaneous current signal supplied to the motor as a function of time over a period of time for three electrical phases of the motor;

simultaneously sensing an instantaneous voltage supplied to the motor as a function of time over the period of time for three electrical phases of the motor;

calculating real power for each of the at least three electrical phases of the motor using the sensed current and voltage signals;

comparing the real power for each of the three electrical phases and selecting two phases having the highest real power consumption; and determining a motor phase having a stator fault, wherein for a motor sequence of ACB, if the two selected phases are A and B, then the phase with the stator fault is phase B, if the two selected phases are B and C, then the phase with the stator fault is phase C, and if the two selected phases are A and C, then the phase with the stator fault is phase A, and for a motor sequence of ACB, if the two selected phases are A and B, then the phase with the stator fault is phase A, if the two selected phases are B and C, then the phase with the stator fault is phase B, and if the two selected phases are A and C, then the phase with the stator fault is phase C.

The present invention also include a method of identifying broken rotor bars in a polyphase induction motor, the motor including a number of pole pairs, by using an electrical signature of the motor, comprising the steps of:

simultaneously sensing an instantaneous current signal supplied to the motor as a function of time over a period of time for at least one electrical phase of the motor;

performing a Fourier Transform on the sensed current signal over at least a portion of the period of time to provide a current signal spectra;

locating a peak in the current signal spectrum at a fifth harmonic of line frequency;

locating a peak in the current signal spectrum at a fifth harmonic sideband of $f_{line}$ (5-2·s);

locating a peak in the current signal spectrum at a fifth harmonic sideband of $f_{line}$ (5-4·s);

locating a peak of the current signal spectrum at a fifth harmonic sideband of $f_{line}$ (5-6·s);

identifying the sideband peaks having an amplitude within a predetermined value of an amplitude of the located fifth harmonic peak, said identified sideband peaks indicating a broken rotor bar.

The present invention also includes a method of evaluating performance of a polyphase induction motor, the motor including a number of pole pairs, by using data from an uncoupled motor condition test and data acquired during a coupled motor condition test, comprising the steps of:

acquiring current data by simultaneously sensing an instantaneous current signal supplied to the motor as a function of time for all three electrical phases of the motor;

acquiring voltage data by simultaneously sensing an instantaneous voltage signal supplied to the motor as a function of time for all three electrical phases of the motor;

measuring individual motor stator resistances in both the uncoupled condition and the coupled condition;

calculating slip from the coupled test data;

calculating total real power dissipated by the motor in both the uncoupled condition and the coupled condition;

calculating stator $I^2R$ loss for both the coupled condition and the uncoupled condition, as the individual currents squared multiplied by the respective individual stator resistances corresponding to the particular motor operating condition;

estimating loss for the uncoupled condition as the total real power less the stator $I^2R$ losses;

estimating core loss as a percentage of the uncoupled loss;

calculating rotor $I^2R$ loss as the total real power less the stator $I^2R$ loss less the estimated core loss, multiplied by slip;

determining stray losses in accordance with a predetermined value based on a machine rating of the motor; and calculating output power as the total real power less the uncoupled loss less the stator $I^2R$ loss in the coupled condition less the rotor $I^2R$ loss in the coupled condition and less the estimated stray losses.

The present invention also includes an apparatus for determining electrical performance of a polyphase motor system using an electrical signature of the motor comprising:

current sensing means for transducing current applied to the motor and generating an analog current signal for at least one electrical phase of the motor;

analog-to-digital converter means for converting the analog current signals to respective digital current signals;

storage means for storing a time history of the digital current signals;

processor means for generating a Fourier transform on the stored digital current signals to provide current signal spectra;

peak locating means for locating a maximum peak in a predetermined frequency range of the current signal spectra and a peak indicative of line frequency; and arithmetic means for calculating a shaft speed of the motor from the located maximum peak and the line frequency peak.

The present invention further includes a means for displaying motor phasor information, which can be used in lieu of or in addition to a traditional phasor diagram. The display is a bar chart for displaying motor voltage and current information comprising:

a horizontal axis;

a first bar chart for plotting phase to neutral voltages as bars which graphically represent phase-to-neutral voltages of the motor, the first bar chart located on a first side of the horizontal axis; and a second bar chart for plotting phase currents as bars which graphically represent phase currents of the motor, the second bar chart located on a second, opposite side of the horizontal axis, wherein the voltage bars are positioned along the horizontal axis according to their respective phase angles and the current bars are positioned along the horizontal axis according to their respective phase angles, such that a power factor angle can be determined directly from the common axis.

The present invention also includes a method of checking placement of voltage and current probes on corresponding phases of a polyphase induction motor, comprising the steps of:

(a) simultaneously sensing an instantaneous current signal supplied to the motor as a function of time for all three phases of the motor;

(b) simultaneously sensing an instantaneous voltage signal supplied to the motor as a function of time for all three phases of the motor.

(c) demodulating the sensed current and voltage signals to provide an RMS value and per phase values for the three current and the three voltage signals;

(d) comparing each of the voltage and current probe signals to a first predetermined value of voltage and current respectively;

(e) comparing a difference between the demodulated phase values of the three voltage signals and a particular voltage threshold (typically 30 degrees) in order to verify that any two or all of the voltage probes are not placed on the same phase;

(f) requiring that the differences between the demodulated phase values of the three current signals are all greater than a particular current threshold in order to verify that any two or all of the current probes are not placed on the same phase; and (g) requiring that a cosine of the resulting power factor angles, respectively, of the three phases are positive and that a difference between a maximum and a minimum of the power factor angles of the three phases is less than a particular power factor threshold (typically 30 degrees) in order to verify that none of the current probes or voltage probes are switched or reversed.

The present invention also includes a method of checking for correct placement of current and voltage probes on corresponding phases of a polyphase induction motor comprising the steps of:

simultaneously sensing an instantaneous current signal supplied to the motor as a function of time for all three phases of the motor;

simultaneously sensing an instantaneous voltage signal supplied to the motor as a function of time for all three phases of the motor;

demodulating the sensed current and voltage signals to provide an RMS value and phase values for the current and voltage signals;

calculating resulting power factor angles for all phases for each of six possible cases of switching of probes, viz, (i) no switching, (ii) probes A and B switched, (iii) probes B and C switched, (iv) probes C and A switched, (v) probe A on phase C, probe B on phase A, probe C on phase B, and (vi) probe A on phase B, probe B on phase C, probe C on phase A;

calculating resulting power factor angles for all of the phases with the current probes reversed;

of the six cases mentioned, selecting two cases which give power factor angles between 0 and 90 degrees for all three phases, using the power factor angles;

calculating total real power of the motor for each of the two selected cases; and recommending the two selected cases along with the values of the total real power, power factor angle and RMS current for each of the two cases for switching correction.

Finally, the present invention includes a method of checking for correct placement of current and voltage probes on corresponding phases of a polyphase induction motor comprising the steps of:

simultaneously sensing an instantaneous current signal supplied to the motor as a function of time for all three phases of the motor;

simultaneously sensing an instantaneous voltage signal supplied to the motor as a function of time for all three phases of the motor;

demodulating the sensed current and voltage signals to provide an RMS value and phase values for the current and voltage signals;

calculating resulting power factor angles for all phases for each of six possible cases of switching of probes, viz, (i) no switching, (ii) probes A and B switched, (iii) probes B and C switched, (iv) probes C and A switched, (v) probe A on phase C, probe B on phase A, probe C on phase B, and (vi) probe A on phase B, probe B on phase C, probe C on phase A;

calculating resulting power factor angles for all of the phases with the current probes reversed;

of the six cases, selecting two cases which give power factor angles between 0 and 90 degrees for all three phases, using the power factor angles for each phase;

calculating total real power of the motor for each of the two selected cases; and recommending the two selected cases along with the values of the total real power, power factor angle and RMS current for each of the two cases for switching correction.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 9 is a Condition/Performance Report (CPR) display, including example values, in accordance with the present invention;

FIG. 16 is prior art phasor diagram illustrating voltage and current information where A and B current probes are switched;

FIG. 17 is a bar diagram in accordance with the present invention displaying the voltage and current information of FIG. 16;

DESCRIPTION OF THE PREFERRED EMBODIMENT

The present invention is directed to an apparatus and method of comprehensively evaluating the condition and performance of induction motors, particularly three-phase induction motors, through the use of a motor monitor. The motor monitor can be linked to a processor executing analysis and database software for storing motor data and analyzing and reporting on the condition of the motor. The motor monitor can be connected to the processor through a variety of means, including both hard-wired means and non-hardwired means, such as by infrared or other wireless transmission.

Figure 1:
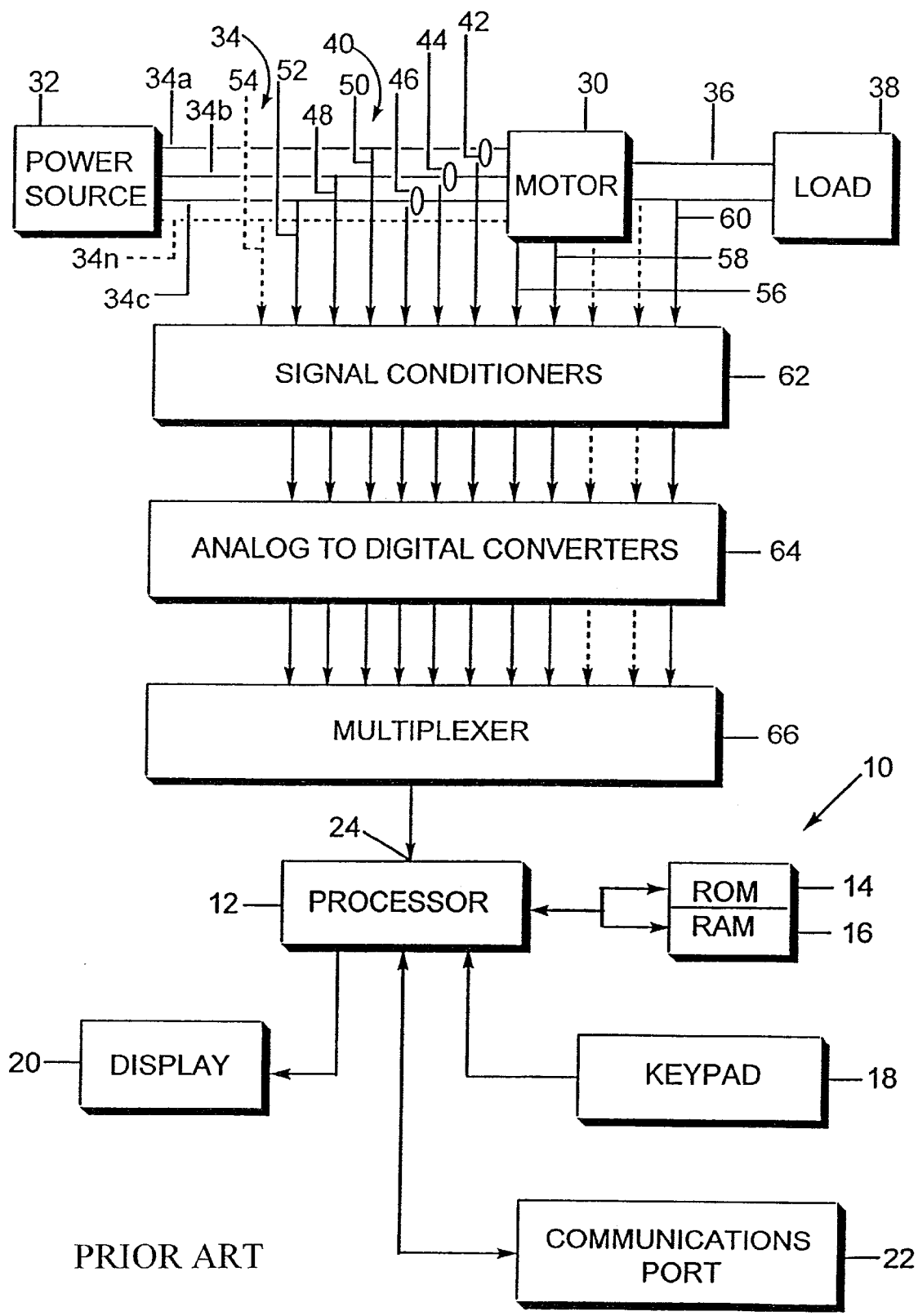
FIG. 1 is a functional schematic block diagram of a preferred embodiment of a system for analysis of a three phase motor in accordance with the present invention.

Referring to the drawings, wherein the same reference numerals indicate like elements throughout the several figures, there is shown in FIG. 1 a functional schematic block diagram of a preferred embodiment of a processor-based motor monitor system 10 which operates in accordance with the methods of the present invention. In the presently preferred embodiment, the system 10 includes a processor 12 which preferably is a commercial microprocessor, such as an Intel x86 type processor or similar processor, although other processors may also be used with the present invention, such as a digital signal processor, as are known to those of ordinary skill in the art of data collection devices. Preferably the processor 12 includes or has access to a memory, which preferably includes a read only memory (ROM) 14 employed for storing fixed information, such as executable processor code and/or fixed data parameters or parameter ranges, and a random access memory (RAM) 16 of a predetermined size which is adapted for temporary storage of data accumulated for analysis. The ROM 14 is of a type well known to those of skill in the art for storing fixed information or information which is not changed by the processor 12 during execution of processor operations. However, the ROM 14 may be of the type which can be reprogrammed (e.g., a PROM, EPROM, EEPROM, etc.) or otherwise changed periodically to update, modify or change how the processor 12 operates. The RAM 16 may also be used for temporarily storing portions of the executable code or input information. As will also be known to those of ordinary skill in the art, other memory devices could also be connected to the processor 12, such as a magnetic or optical storage device, or a PCMCIA compatible storage device (not shown) for storing collected and/or processed data and related information, such as a time stamp.

A keypad 18 is presently employed as the primary user input device to permit a user to communicate with the processor 12. The keypad 18 includes a plurality of buttons or switches for inputting information or commands. In the presently preferred embodiment, the keypad 18 includes buttons for instructing the system 10 to display previously recorded or stored data, including power data and motor condition flag histories for designated time periods, power quality data, such as per phase voltage and current data, and power conversion data, such as input power, output power and motor speed. The keypad 18 also preferably includes one or more buttons related to motor identification information. Although a keypad 18 is presently preferred, it will be appreciated by those skilled in the art that any other type of input device may be employed instead of or in addition to the keypad 18, such as a keyboard, mouse or track ball type device which allows a user to scroll through predetermined command screens, as is known in the art.

A display 20 is connected to the processor 12 for displaying output from the processor 12. The display 20 provides information to a user, such as the per phase voltage and current data, power data and motor identification information, as well as event flag information for alerting the user of a potential problem with the motor system, such as a problem with the motor rotor, the stator, current, voltage, performance, or loading. In the presently preferred embodiment, the display 20 comprises a four line LCD display in combination with an array of LEDs. The LCD display displays motor data, as previously discussed, such as per phase current and voltage data and power information and the LEDs display event flags for alerting the user to potential motor problems. Of course, other types of suitable output devices may be employed in addition to or instead of the display 20, such as a CRT, a VDT, or a printer. In addition to the display 20, a remote display (not shown) may be included which is located at a motor control center (MCC) so that an operator or technician is not required to leave the MCC to check on the condition of a motor. Alternatively, the display 20 could be located remotely from the motor, such as at the MCC.

The processor 12 further includes at least one communication port 22 which may be either a parallel port, a serial port, or both. The communication port 22 is employed for receiving data from another location or device, for transmitting data to another device or for sending data to another location utilizing a modem or other such transmission device (not shown) in a manner well known in the computer art. In the presently preferred embodiment, the communication port 22 is used to download stored information, such as information stored in the RAM 16 to another data storage device or a computer, such as a personal computer system well known to those skilled in the art. Ultimately, in the presently preferred embodiment, information stored in the memory (e.g., the RAM 16) is transmitted to a computer (not shown) operating according to the methods of the present invention, which analyzes and processes the information. In addition, the processor 12 also includes an input port 24 for receiving sensor data, as described in more detail below.

In the presently preferred embodiment, the processor based system 10 comprises a relatively small and unobtrusive device for collecting and storing motor data, which data is then downloaded, transmitted, or otherwise transferred to a computer (not shown), for processing. However, it will be apparent to those of ordinary skill in the art that the system 10, as opposed to being a relatively small and unobtrusive data collection and storage device, could also comprise a more sophisticated device, such as a personal or laptop computer. Also, variations in the input/output components of the system 10 may be made depending upon particular applications. For example, in some applications, both a printer and a video display 20 may be desired. In other applications, a keyboard, as opposed to the small keypad 18 may be desired. It should, therefore, be clearly understood by those skilled in the art that the present invention is not limited to the particular hardware configuration shown in FIG. 1 but may be implemented using any type of hardware configuration suitable for a particular application. The processor based system 10 may comprise a personal computer, or any other suitable type of computer, such as a lap-top computer, mini-computer, main frame computer or the like.

The above-described system 10 is employed for on-line analysis of the operation of a polyphase motor driving a load, the polyphase motor being illustrated schematically as a three-phase motor 30. In the presently preferred embodiment, the present invention is directed particularly to analyzing the performance and condition of a three phase induction motor 30 using only three phases of current and voltage. The motor 30 is connected to a suitable power source 32 utilizing a suitable three-phase cable 34 having individual conductors or supply lines, including an a-phase conductor 34a, a b-phase conductor 34b, a c-phase conductor 34c, and if appropriate, a neutral conductor 34n.

The output of the motor 30 is connected through a suitable output shaft or other type of mechanical transmission means 36 to a load 38 which may be a fan, pump, compressor, valve or virtually any other type of machinery or equipment. Depending upon the application, the transmission means or transmission 36 may include suitable clutches, gearing, belts or other mechanical interconnecting devices (not shown) of a type well known in the art. For the sake of brevity, the combination of the motor 30, transmission 36, and the load 38 will herein sometimes be collectively referred to as the motor system. It should be appreciated by those skilled in the art that the present system 10 may be employed for analysis of polyphase induction motors which may be connected to any suitable type of power source 32 for driving any type of load 38 (even no-load) utilizing any type of transmission means 36, and that the embodiment shown in FIG. 1 is only for the purpose of illustrating a preferred embodiment of the structure and operation of the present invention.

The system 10 further includes a plurality of individual sensors or probes shown collectively as 40, for monitoring predetermined electrical and mechanical variables of the motor 30 and transmission means 36, and for converting the monitored characteristics into electrical signals for processing by the processor 12. In the present embodiment, the sensors 40 include three clamp-on current probes 42, 44, 46, one of the current probes being clamped to each of the conductors 34a, 34b, 34c, of the three phase cable 34 interconnecting the motor 30 with the power source 32. The clamp-on current probes 42, 44, 46 are generally of a type well known in the electrical measurement art and are commercially available from a variety of well known sources. The current probes 42, 44, 46 can be inductive or Hall effect or any other type which converts current in a conductor into a related voltage signal. The currents may also be transduced by current shunts or by current transformers instead of the clamp-on type of sensors. Additional, optional current sensors (not shown) for detecting ground leaks may be provided for surrounding two or more phase leads. The probes may be applied to the motor circuit directly or to any control circuit which follows the phase currents proportionally. When current transformers (not shown) are used, the present invention corrects or compensates for any amplitude and phase shifts caused by the transformers, as described in more detail below. Since current probes are known to those of ordinary skill in the art, complete details of the structure and operation of the current probes 42, 44, 46 are not necessary for a complete understanding of the present invention.

The sensors 40 further include voltage probes 48, 50, 52, each of which is connected to one of the conductors 34a, 34b, 34c of the three phase cable 34 and, if a neutral conductor 34n, shown in phantom, is present, a fourth voltage probe 54 is connected to the neutral conductor 34n of the cable 34. The voltage probes 48, 50, 52, 54 are generally of a type well known in the art and are commercially available from a variety of sources. For larger power systems with higher voltages, direct connection of the voltage probes 48, 50, 52 to the individual phase conductors 34a, 34b, 34c is generally impractical, and thus, potential transformers (not shown) may be used which reduce the voltage at the measurement point. The probes 48, 50, 52 are still used, but are connected to the output of the respective potential transformer instead of directly to each of the individual phase conductors 34a, 34b, 34c. As discussed in more detail below, if the voltage probes 48, 50, 52 are connected to a transformer, then compensation is made, in the present invention via software, for any reduction in voltage and any phase shifts caused by the transformer (for instance, as is known in the art, wye-delta and delta-wye transformers introduce a 30° phase shift). Since voltage probes are generally commercially available and known to those of skill in the art, further details of the structure and operation of the voltage probes 48, 50, 52, 54 are not necessary for a complete understanding of the present invention.

In addition to the above-discussed electrical sensors, the present system 12 may include one or more mechanical sensors. The mechanical sensors may include a vibration sensor 56 which may be an accelerometer, an acoustic sensor 58, and a tachometer 60 providing a once per revolution phase reference for sensing the rotating speed of the output shaft of the motor 30 and of the shaft of the load 38 if different due to an intervening gear box or belt within the transmission 36. One or more additional mechanical probes may also be provided. Such additional mechanical probes may include pressure transducers, vibration sensors, temperature probes, proximity probes, force sensors, torque sensors and accelerometers having different locations or orientations from that of sensor 56, etc. Each of the mechanical sensors are adapted to receive and convert sensed mechanical parameters related to the operation of the motor system into analogous standard electrical signals. Details of the structure and operation of the various mechanical sensors are not necessary for a complete understanding of the present invention. It should be understood by those skilled in the art that while certain mechanical sensors are specifically discussed and illustrated, other mechanical sensors may be employed either in addition to the discussed sensors or as an alternative to the discussed sensors. Thus, the use of a particular type of mechanical sensors employed in the presently preferred embodiment should not be viewed as a limitation upon the invention.

The system 10 further includes a plurality of signal conditioners 62 which are illustrated collectively in FIG. 1. Preferably, a separate signal conditioner is provided for each of the sensors 40, with the respective output of the sensor 40 being connected directly to the input of the respective signal conditioner 62. Each of the signal conditioners 62 functions in a manner well known in the art to amplify, impedance match, filter and otherwise standardize and improve the electrical output signals received from the sensors 40. Standardization of signals includes conversion of currents to a proportional voltage, amplitude scaling and appropriate filtering to limit bandwidth. The precise structure and operation of each signal conditioner depends upon the particular type of sensor 40 with which the signal conditioner 62 is employed. Preferably, each of the signal conditioners 62 also includes an anti-alias low pass filter which functions to improve the integrity of the acquired sensor data by filtering out, prior to digitizing, sensor signal frequencies greater than approximately half of the sampling rate of the digitizer.

The system 10 further includes a plurality of individual analog-to-digital (A/D) converters 64 shown collectively in FIG. 1. The A/D converters 64 function in a manner well known in the art to receive the conditioned and filtered analog output signals from the corresponding signal conditioner 62 and convert the received analog signals at a predetermined sampling rate into digital signals (i.e., a stream or array of digital data) for data manipulation and analysis by the processor 12. A typical sampling rate could be 1,000 samples per second for each signal. Thus, each of the A/D converters 64 produces an output data array or bit stream corresponding to the particular sensor 40 with which the analog-to-digital converter is associated.

The outputs of each of the A/D converters 64 are provided to the input of a multiplexer 66. The multiplexer 66 which, in the present embodiment is preferably a time division multiplexer, receives the digital data signals from each of the A/D converters 64 and in a manner well known in the art transmits the received digital data signals to an appropriate serial input port 24 of the processor 12 in a predetermined time spaced order. It will be appreciated by those skilled in the art that the signal conditioners 62, A/D converters 64, and multiplexer 66 which are employed in connection with the presently preferred embodiment, are each of a type well known in the art and available from a variety of manufacturers. Complete details of the structure and operation of the signal conditioners 62, A/D converters 64, and multiplexer 66 are generally well known and need not be described in greater detail herein. Suffice it to say that the signal conditioners 62, A/D converters 64, and multiplexer 66 cooperate to take the raw analog output electrical signals from the electrical and mechanical sensors 40 and convert the raw signals into a digital form suitable for processing by the processor 12. It will be appreciated that the functions of the signal conditioners 62, A/D converters 64, and multiplexer 66 may be combined into a single sub-assembly or may be performed in any of several different manners. Moreover, the arrangement of the component parts may vary from what is shown in FIG. 1, for instance, the analog signals detected by the sensors 40 could be multiplexed prior to being converted to digital signals by the A/D converters 64. Thus, while the preferred embodiment employs such components, the particular components are not intended to be a limitation on the present invention.

The processor 12 receives and analyzes the digital signals from the A/D converters 64 and stores the digital data signals in the RAM 16. In the presently preferred embodiment, each of the conditioned and digitized signals from each of the three current probes 42, 44, 46, and from the three voltage probes 48, 50, 52 are individually analyzed and processed by the processor 12. As will be appreciated, the processor 12 operates in accordance with the processor software, preferably stored in the ROM 14 or otherwise stored and accessible for execution by the processor 12. Alternatively, the present invention may be implemented using other means, such as hard-wired logic circuits (not shown) used in combination with or instead of the processor and software.

Figure 2:
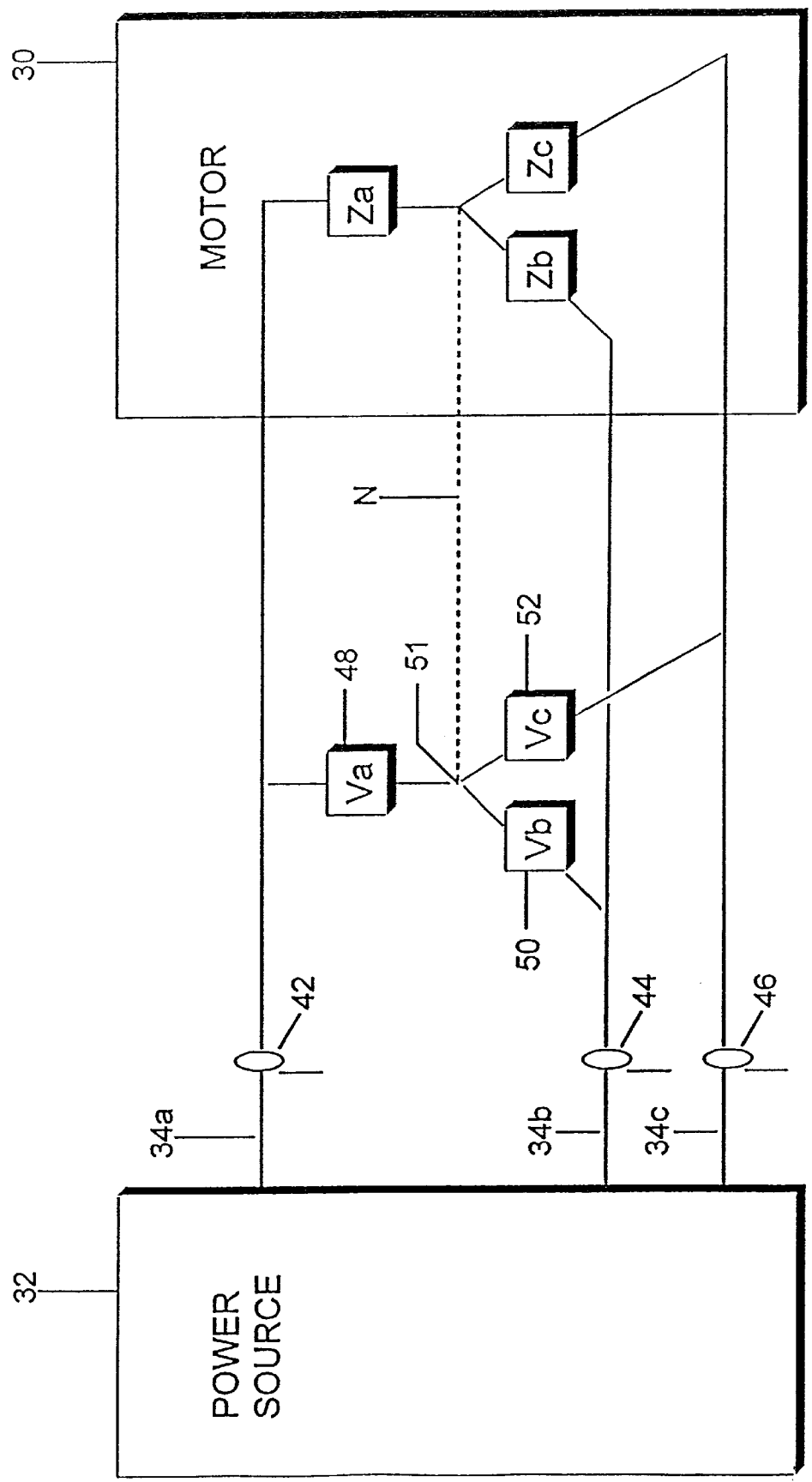
FIG. 2 is a more detailed functional schematic diagram of a portion of the system shown in FIG. 1.

FIG. 2 shows in greater detail the manner in which the electrical measurements are taken. In the illustrated embodiment, both the motor 30 and the voltage probes 48, 50, 52 are connected in a wye configuration, with an artificial neutral phase for measuring the phase-to-neutral voltage. One terminal of each of the voltage probes 48, 50, 52 is physically connected to each of the individual phase conductors 34a, 34b, 34c, respectively, with the other terminals of the voltage probes 48, 50, 52 being connected together at point 51 to form an artificial neutral. An optional neutral connection line (N) shown in phantom may be connected to the neutral of the motor circuit when the motor circuit is accessible.

The input wye circuit provides the capability to analyze both three and four wire wye motor configurations. When no external neutral (n) connection is made, the common "star point", indicated at 51, of the 3-wire wye circuit is driven to the algebraic mean of the three voltage inputs $V_a$, $V_b$, and $V_c$. That is, the star point 51 automatically assumes the "pseudo-neutral" potential (proper neutral for a balanced system). This allows the wye circuit to function as a "line-to-line to phase-to-neutral converter". The wye configuration has been found to work well, and is preferred, for 3-wire wye, 4-wire wye, and delta configured motors. In the delta and 3-wire wye configured cases, the neutral (N) is not connected. Although for delta and 3-wire wye configured motors measured with a wye apparatus the individual phase-to-neutral values are artificial, the individual current and line-to-line voltage measurements are accurate, as are the total real, reactive, and apparent powers, and total power factor, and all measurements based on these measurements. In the case of a motor configured as a 4-wire wye, if the neutral (N) is connected as shown in FIG. 2, all measurements are accurate, including phase-to-neutral measurements. It should be understood that while the voltage probes 48, 50, 52 illustrated in the present embodiment are preferably connected in a wye configuration, other connections, such as a delta type connection may be used.

FIGS. 3–8 are general flow diagrams of methods of the present invention, which methods are readily implemented in software which may be executed by the processor 12 or which may be executed on a computer, such as a personal computer, to which the data collected by the sensors 40 and stored in the system memory has been transferred. In the presently preferred embodiment, the processor based system 10 collects and stores the data collected by the sensors 40. The collected and stored data is then down loaded to a computer loaded with software implementing the data analysis methods of the present invention for providing analysis of the operation of the polyphase motor 30, its transmission 36, and its load 38 (i.e., the motor system). The computer manipulates the sampled digital data received from the electrical and mechanical sensors 40 in a manner hereinafter described and generates highly accurate outputs in the form of discrete data or plots of data versus time (traces) corresponding to particular electrical and mechanical parameters from which specific problems and faults can be identified. In addition, the present invention automatically detects such faults and indicates same to the user in high-level text messages, such as "stator winding fault". Only the particular identified problem(s) need then be repaired, be it on the motor 30, transmission 36, or load 38, thereby saving the cost of a complete motor system overhaul. Although the steps in the flow diagrams are shown as being executed sequentially, it will be understood by those of ordinary skill in the art that at least some and possibly many of the steps may be implemented in parallel and are not necessarily dependent upon the prior step shown in the flow diagram being executed first. Accordingly, the present invention is not meant to be limited to performing each of the steps shown in the exact sequence shown.

As previously discussed, the sensors 40 and related hardware (signal conditioners 62 and A/D converters 64) often introduce phase shifts or time delays between the data signals of each of the individual phase conductors 34a, 34b, 34c. In the present invention, the phase relationship between each of the conductors or supply lines 34a, 34b, 34c is important, and thus the present invention compensates for such phase shifts introduced into the digital data signals without the use of any added hardware, such as a phase meter.

Figure 3:
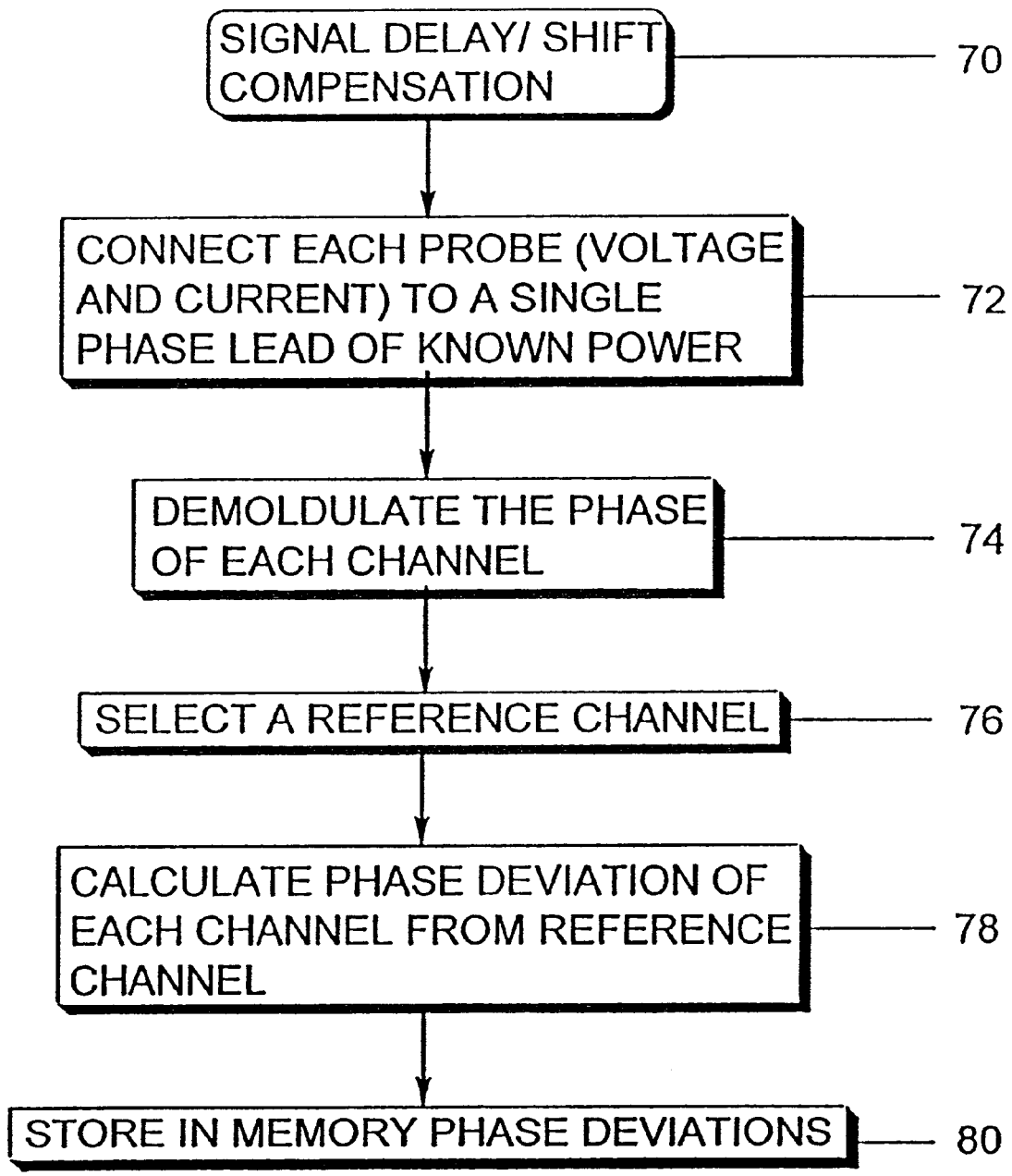
FIG. 3 is a flow diagram of a preferred method of calibrating the sensors in accordance with the system of FIG. 1.

Referring now to FIG. 3, the manner in which such phase shifts or time delays introduced into the digital data signals is compensated for is shown beginning at block 70, by calibrating the probes 42–52 and the associated signal conditioners 62 and determining a phase deviation for each of the digital data signals associated with each of the phase conductors 34a, 34b, 34c. Compensation for system errors is important because it is desirable to measure current and voltage phases very accurately in order to accurately determine power factor and power (real, reactive and apparent) for the polyphase motor 30. First, at step 72, the three current probes 42, 44, 46 and the three voltage probes 48, 50, 52 are placed on a single-phase lead (i.e., one of 34a, 34b or 34c) of known power factor from which the actual phase difference between the voltage and current can be computed. The power factor of the selected phase lead is determined using a calibrating instrument to provide a single phase current which is either in phase with the voltage or at a known out-of-phase relationship to the voltage. Alternatively, the power factor of the selected phase lead may be determined using an arbitrary but stable circuit having voltage and current measured using the sensors 42–52, and having a power factor or power factor angle which may be verified using either a calibrated phase meter or power factor meter (not shown).

The phase of each data signal (from each probe or channel) is then demodulated by means of any standard demodulation technique at step 74 by the processor 12. The preferred demodulation technique is to calculate the Fast Fourier Transform (FFT) of the data signal, zero the DC component, folding frequency and negative frequencies, double the positive frequencies, and then perform an inverse FFT. The phase is the four quadrant arctangent (usually known as atan2) of the imaginary component divided by the real component. Then the phase is unwrapped (it is preferred not to use a modulo-2 pi phase representation). All of the FFTs (of the different probe signals) are taken over the same time interval. At step 76, one probe signal is selected as a reference and then at step 78, the reference signal value is subtracted from all of the other probe data signals. Finally, in step 80, the phase deviation for each of the probes is stored (a value of zero is stored for the probe selected as the reference) in memory, such as the RAM 16. As a result of this process, the reference signal is at zero degrees, and the other probe data signals are referred to in relation to the reference signal.

The signal conditioners 62 can be phase-calibrated with the sensors 40 or separately, as desired. That is, the phase shift produced solely by the signal conditioner 62 is measured and compensated by itself (separate from the associated sensor) or a single phase shift measurement and correction is made for the each sensor 42–52 and its associated signal conditioner 62 as a unit. Once the phase deviation associated with each sensor 42–52 is determined (with respect to the reference sensor), the phase is corrected in subsequent calculations by subtracting a phase offset (i.e., the phase deviation) from the measured value. In this manner, all of the sensors 42–52 are brought into phase alignment so that any phase differences subsequently measured can be attributed strictly to motor and source characteristics.

When sensors are employed in which the phase shift or sensitivity is a function of frequency or current amplitude, this effect is compensated for by either determining the functional relationship between the dependent and independent parameter (for example, effect of frequency, the independent parameter, on-phase shift, the dependent parameter) and adjusting the phase values in accordance with measured line frequency or by creating a table relating the correction to the independent parameter, and looking up the appropriate correction for each case of the independent parameter in the table (e.g., a look-up table stored in memory such as the RAM 16).

In order to calculate shaft speed and motor slip, the present invention analyzes spectral signatures of raw current data, received from the current sensors 42–46. For verification, both the shaft frequency and the pole-pass frequency are identified and used to calculate the shaft speed. The shaft frequency and the pole-pass frequency show up as sidebands around the line frequency on raw current data. The shaft frequency sidebands occur at $f_{line} \pm (1-\text{slip})f_{synch}$ and the pole-pass frequency sidebands occur at $f_{line} \pm (2 \cdot \text{slip})f_{line}$; where $f_{synch}$ is the synchronous frequency equal to $2 \cdot f_{line}$/number of poles and $f_{line}$ is the line frequency, which is the dominant peak in the spectrum. In the case of the shaft frequency, the upper sideband is used to calculate shaft speed and in the case of pole-pass frequency, the lower sideband is used to calculate shaft speed, since the lower sideband is expected to have a larger amplitude than the upper sideband. After identifying the pole-pass sideband and the shaft sideband frequency peaks, their amplitudes are compared and the peak with the larger amplitude is selected for shaft speed calculation.

An alternative method of determining shaft speed is to use demodulated current signals to calculate the true shaft speed. That is, instead of analyzing the raw current signals, a demodulated current signal is analyzed, as follows: The demodulation process downshifts all frequencies by the line frequency so that the shaft sideband frequencies now show up at the actual shaft frequency, $(1-\text{slip}) f_{synch}$, and the pole-pass sideband frequencies show up at the pole-pass frequency, $(2-\text{slip}) f_{line}$. The same logic is employed as before, namely, the range (of reasonable occurrence) of shaft frequency is determined and the highest peak is selected in this range. A reasonable range for the shaft frequency is from 0.9 $f_{synch}$ to $f_{synch}$. The pole-pass frequency can occur from but not including DC in the demodulated signal (actually 4Δf, where Δf is the frequency resolution of the FFT, for a Kaiser-Bessel window) to 0.2 $f_{line}$. The logic of checking for outliers among the phases, averaging the results and selecting the final values is the same as for the demodulated case.

Figure 4:
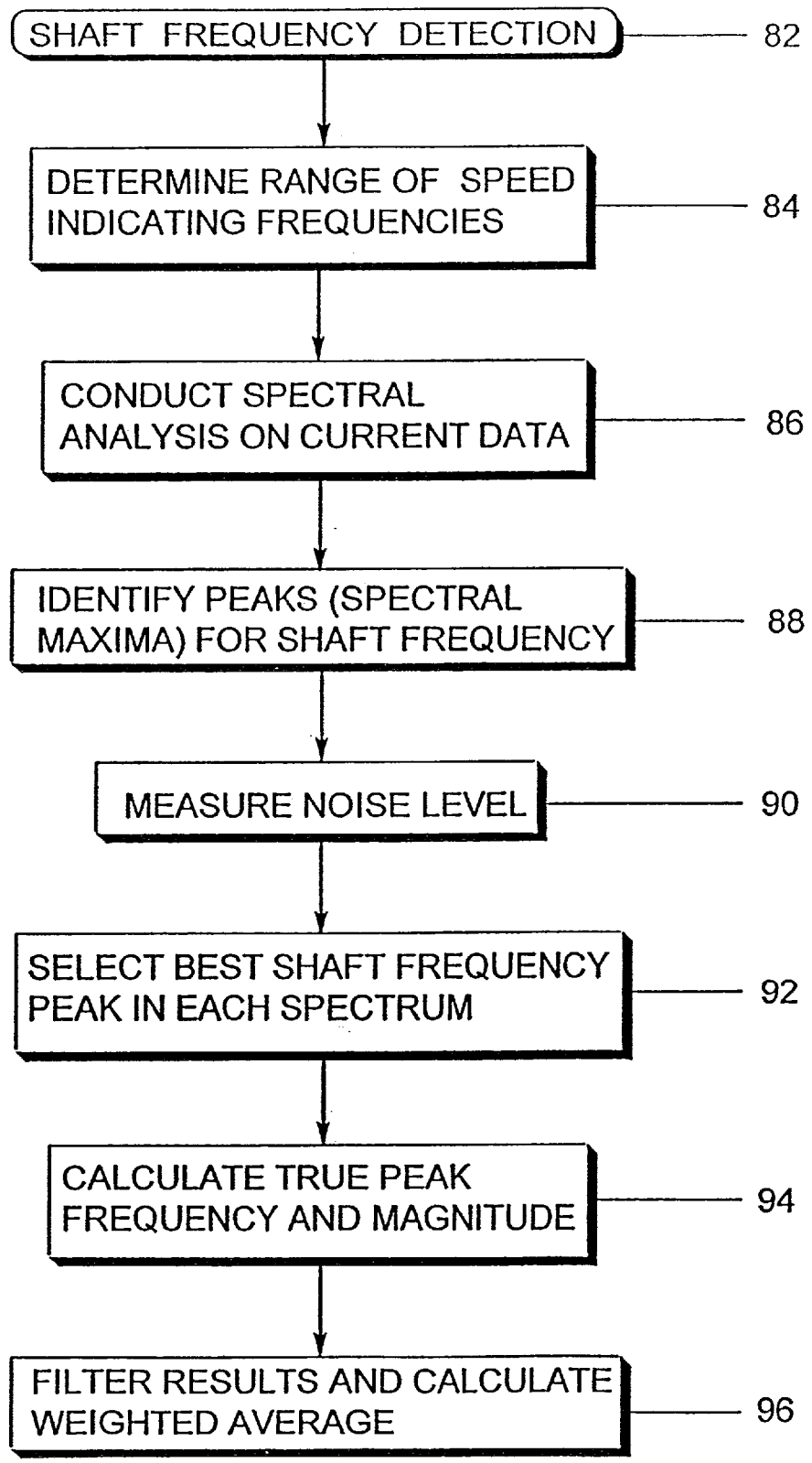
FIG. 4 is a flow diagram of a preferred method of determining shaft speed and slip utilizing the spectra of current traces in accordance with the system of FIG. 1.

Referring now to FIG. 4, a flow diagram of a preferred method of determining shaft frequency is shown. It will be understood by those of ordinary skill in the art that program flow diagrams or charts can represent various degrees of program operational details, ranging from high-level flow diagrams which show the principles embodied by the program to low-level flow diagrams which detail each step of the program operation. FIG. 4 is a high-level flow diagram. However, it will be understood by those of skill in the art from this disclosure that a computer program can be written which embodies the principles set forth by this disclosure. Further, the preferred embodiment of the invention disclosed herein is described with reference to specific values or numbers of time samples, etc., such as a sampling rate of 1000 samples per second (sps). It should be understood that such values are provided for the sake of example only and are not meant to limit the invention, as the specific values are not critical. The values may vary and are adjusted for various applications. For example, 32,768 samples at 1000 sps is used because it provides a reasonable bandwidth, a sufficiently long time record for adequate frequency resolution and because a power of two lends itself to rapid calculation using the Cooley-Tukey FFT algorithm (discussed below).

The shaft frequency detection routine of FIG. 4 is shown beginning at block 82. As previously discussed, the present invention analyzes spectral signatures of raw current data to calculate shaft speed and uses the shaft sideband frequency and the pole-pass sideband frequency for verification. First, at step 84, the predetermined range of speed indicating frequencies narrows down the range of the spectrum that must be examined for shaft frequency, by estimating the range of the shaft sideband frequency to be from (0.9·$f_{synch}$+$f_{line}$) up to but not including ($f_{synch}$+$f_{line}$) Spectral analysis is conducted at step 86 on the current data obtained from the current probes 42–46 by examining, for example, 32.768 seconds of current data. First, the DC component of the current signal is subtracted out. The DC component is calculated as the average value of the current signal over the 32,768 points. Then, a 32,768 point window, such as the Kaiser-Bessel, is applied to the current signal by multiplying the 32,768 point current signal by an equal length standard FFT window, such as the Hanning or Kaiser-Bessel. The Kaiser-Bessel window is preferred because it provides superior selectivity in the frequency domain. The FFT is calculated using a standard Cooley-Tukey algorithm and dividing the resulting spectra by N, where N is the number of points. Adjustments are then made to the amplitude to compensate for window effects. Finally, a one-sided spectrum is calculated by eliminating the negative AC frequency components, doubling all of the remaining (positive) AC components and selecting the spectral lines from DC to the folding frequency (half sampling rate). The Cooley-Tukey power of two FFT is preferred because of its speed. However, any FFT, such as the N-point algorithm, may be used. The preferred FFT algorithm should not be limiting. Also, the one-sided spectrum is convenient to work with and is preferred, but again is not meant to be limiting.

In step 88, the highest spectral peak is identified using the current sensor data, and all peaks within 12 dB of the highest peak are identified as candidate peaks. Broad peaks are eliminated by requiring that for the first three frequency intervals on each side of a candidate peak, one of the intervals must show a 12 Db drop in amplitude (i.e., there must be significant roll-off from the local maxima). In addition, the line frequency peak and glitches are eliminated from consideration by requiring that the first three frequency lines on each side of a candidate peak be monotonically decreasing in magnitude. After elimination of false peaks, the highest peak in the range of interest is selected for each of the three spectra (i.e., $I_a$, $I_b$, $I_c$).

Step 90 is an alternate way of eliminating broad peaks. Step 90 measures the RMS noise level to determine a noise floor in the spectra and screen out non-discrete peaks using the current spectra and the list of candidate peaks, by measuring the RMS noise level of the spectrum range and deleting spectral components within ±0.3 Hz of the peaks. In addition, any peaks whose amplitude at a point halfway to the noise floor is greater than the FFT window roll-off plus a tolerance for noise are eliminated, in order to eliminate nondiscrete signals.

In step 92, the best shaft frequency peak in each of the three spectra is selected as the maximum amplitude of each of the peaks remaining after step 90.

In step 94, the precise parameters of each of the three peaks selected in step 92 are determined by calculating the true peak frequency and the magnitude of each of the three peaks by applying picket fence corrections for the Kaiser-Bessel window. For isolated peaks well above the noise level, this identifies the parameters with high accuracy.

For the Hanning window, the picket fence corrections are given as:

$$\text{frequency correction, } \Delta f_c = \frac{2 - 10^{\Delta dB/20 dB}}{1 + 10^{\Delta dB/20 dB}} \cdot \Delta f$$

where ΔdB amplitude difference between the two highest lines around the peak;

amplitude correction, $$\Delta L = 20 \cdot \log_{10} \left| \frac{\sin(\pi \cdot \Delta f_c / \Delta f)}{\pi \cdot \Delta f_c / \Delta f} \cdot \frac{1}{1 - (\Delta f_c / \Delta f)^2} \right|$$

For a Kaiser-Bessel window, the picket fence corrections are calculated as follows: (a) applying the Kaiser-Bessel window to the data; (b) calculating a one-sided FFT of the weighted data (in dB); (c) locating the highest peak in the specified range and finding the frequency and amplitude corresponding to that peak (denoted as est_freq and est_amp respectively). If two peaks of the same amplitude are found, then: true signal frequency=frequency corresponding to left peak+del_f/2; true peak=amplitude of left peak+ 1.0175131556 (dB); (d) checking the amplitudes of the closest spectral lines on both sides of the highest peak, wherein if the line on the left of the highest peak is higher than the line on the right, then flag=−1, and if the line to the right of the peak is higher than the line to the left of the peak, then flag=+1, and if both the line on the left of the peak and the line on the right of the peak are equal, then no corrections are required; (e) calculating del_db=amplitude of highest peak−amplitude of next highest peak (del_db is always positive); (f) calculating del_fc=((−0.120583213·del_db)+0.498649196)·del_f del_f=frequency resolution of the FFT and del_fc is between 0 and del_f/2; (g) calculating the signal frequency (cal_freq) as:

if flag=+1; cal_freq=est_freq+del_fc;

if flag=−1; cal_freq=est_freq−del_fc;

(h) calculating del_L=((−0.060538416·del_db$^2$)+(0.495432455·del_db)+ 1.01575381)

(del_L is always positive); and
(i) calculating the true peak as: est_amp+del_L.

Finally, in step 96, a best estimate of true shaft speed is determined using all available information and weighting the influence of each bit of information by the strength of the signal. However, prior to performing a weighted average calculation, in order to prevent extraneous signal values (i.e., an outlier) from corrupting the averaging process, any of the three peaks that is not within (equal to or less than) 0.1 Hz of the other peaks (nonlinear filtering) is eliminated. If no peaks are found to be within 0.1 Hz of each other, then a message is sent to the user that the speed cannot be determined and the program then allows the user the option of estimating the speed (in RPM). If there are peaks found within 0.1 Hz of each other, then, of the three (or fewer) remaining peaks, an average is calculated weighted by the energy (magnitude squared) of each peak. The shaft frequency is then calculated by subtracting the line frequency from the average.

If there are serious interfering tones (i.e., tones of approximately the same amplitude as the shaft frequency tones) in the spectrum which prevent confident detection of shaft frequency, the calculation is improved by demodulating the raw current signals, calculating the magnitude of the demodulated current signals, calculating a spectrum for each electrical phase, and then using the complex results to calculate the zero sequence spectrum which detects the diagnostic tones and attenuates the interfering tones.

Figure 5:
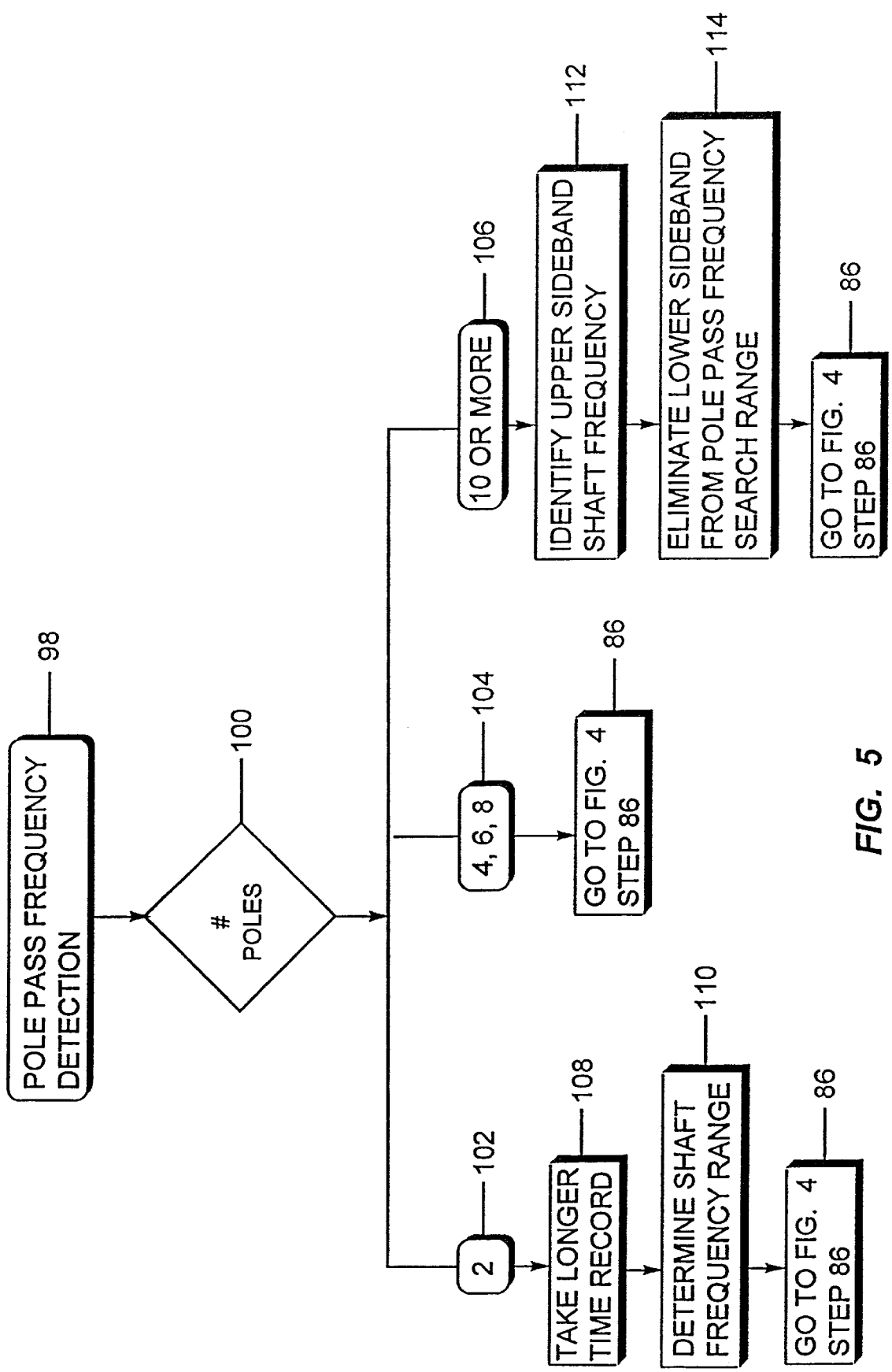
FIG. 5 is a flow diagram of a preferred method of detecting pole pass frequency in accordance with the system of FIG. 1.

Referring now to FIG. 5 a flow diagram of a preferred method of determining pole pass sideband frequency in accordance with the present invention is shown, beginning at step 98. The procedure for determining pole pass sideband frequency is similar to the aforedescribed procedure for determining the shaft sideband frequency. The range of the spectrum that is examined for pole-pass frequency is: $0.8 \cdot f_{line}$ to $(f_{line}-4 \cdot \Delta f)$, where $\Delta f$ is the resolution of the FFT ($\Delta f=1/32.738$). A 4–$\Delta f$ factor is used to account for rolloff of the Kaiser-Bessel window, which in the worst case (when a true peak is at the center of 2 spectral lines) spans ~4 spectral lines on either side of the true peak. This 4–$\Delta f$ factor imposes a lower bound on the slip value (i.e., slip value below which the pole-pass frequency cannot be identified). For $\Delta f=1/32.768$, slip must be greater than $(4-\Delta f)/(2 \cdot f_{line}=\sim 0.1\%$ for 60 Hz line frequency. Although 4·$\Delta$ is preferred, 5·$\Delta$ can be used for added safety.

At decision block 100, before calculating the pole pass sideband frequency, the number of poles is determined. If the number of poles is unknown, it is calculated for induction motors by the steps of: (a) dividing the line frequency by the nominal or approximate or nameplate shaft frequency, using the same units; (b) rounding to the next lower integer; and (c) multiplying by two. If the number of poles is two, program execution proceeds with step 102. If the number of poles is 4, 6 or 8, then execution proceeds with step 104. If there are ten or more poles, then execution proceeds with step 106.

In the case of two pole motors, the synchronous frequency is equal to the line frequency. This implies that at very low loads/slip values, it is difficult to detect the shaft frequency because of its proximity to the second harmonic of the fundamental frequency. The lower limit on the slip, in case of a 32,768 point FFT, is $(4/32.768)/f_{synch}=0.2\%$ for a 60 Hz line frequency, whereas for a 65,536 point FFT, the lower bound on the slip is $(4/65.536)/f_{synch}=0.1\%$ for a 60 Hz line frequency. Accordingly, it is presently preferred to use an increased data acquisition period (at least 65.536 seconds) at step 108.

At step 110, the shaft sideband frequency search range is calculated as $1.9 \cdot f_{line}$ to $(2 \cdot f_{line}-4 \cdot \Delta f)$, where $\Delta f=1/65.356$. This search range avoids the second harmonic being mistaken as the shaft sideband frequency peak. For pole-pass sideband frequency detection the lower bound equals $(4/65.536)/(2 \cdot f_{line})=0.005\%$. The pole pass sideband frequency is then calculated using the steps outlined in FIG. 4 for determining shaft sideband frequency, beginning with step 86.

At step 104, if the number of poles is four, six, or eight, then the procedure outlined in FIG. 4 for determining shaft sideband frequency is used, beginning with step 86. At step 106, for motors with 10 poles (or more), the range of the lower sideband shaft frequency is a subset of the estimated pole-pass sideband frequency range (lower sideband). When the shaft sideband frequency peak has a larger amplitude than the pole-pass sideband frequency peak (usually in case of motors without rotor faults), this can result in the shaft sideband frequency peak being wrongly identified as the pole-pass sideband frequency peak. Therefore, for motors with 10 (or more) poles, it is important that the upper sideband shaft frequency peak is identified first (as is the usual case), at step 112. The upper sideband shaft frequency peak is identified as the highest peak in the predefined range $(f_{line+}(1\text{-slip})f_{synch})$ Then, the corresponding lower sideband is eliminated from the pole-pass frequency search range at step 114 by eliminating ±4 spectral lines about the lower sideband shaft frequency. Note that this is not necessary for fewer than 10 pole motors. After eliminating the lower sideband, the procedure outlined in FIG. 4 for determining shaft sideband frequency is used, beginning with step 86.

The above procedure does not work when the pole-pass sideband frequency peak has a larger amplitude than the shaft sideband frequency peak, due to broken rotor bars or otherwise, and the loading on the motor 30 is such that the pole-pass sideband frequency peak is located in the shaft sideband frequency range. Such conditions result in the shaft sideband frequency peak and the pole-pass sideband frequency peak being mistaken for each other, though the range of slip (load) over which this is possible is very small. For example, for a 10-pole motor with a pole-pass sideband frequency peak with a larger amplitude than the shaft sideband frequency peak, the slip range which may create problems is 9%–10%; for a 22-pole motor with a pole-pass sideband frequency peak with a larger amplitude than the shaft sideband frequency peak, the slip range which may create problems is 4.09–4.55%.

In the case of the pole-pass sideband frequency being identified as the shaft speed indicator, slip is calculated first, then the shaft speed is calculated. Slip is an important parameter when calculating efficiency. Slip is calculated from synchronous speed and shaft speed and is expressed as a percentage, as follows: Slip (%)=(synchronous speed−shaft speed)*100/synchronous speed.

Figure 6:
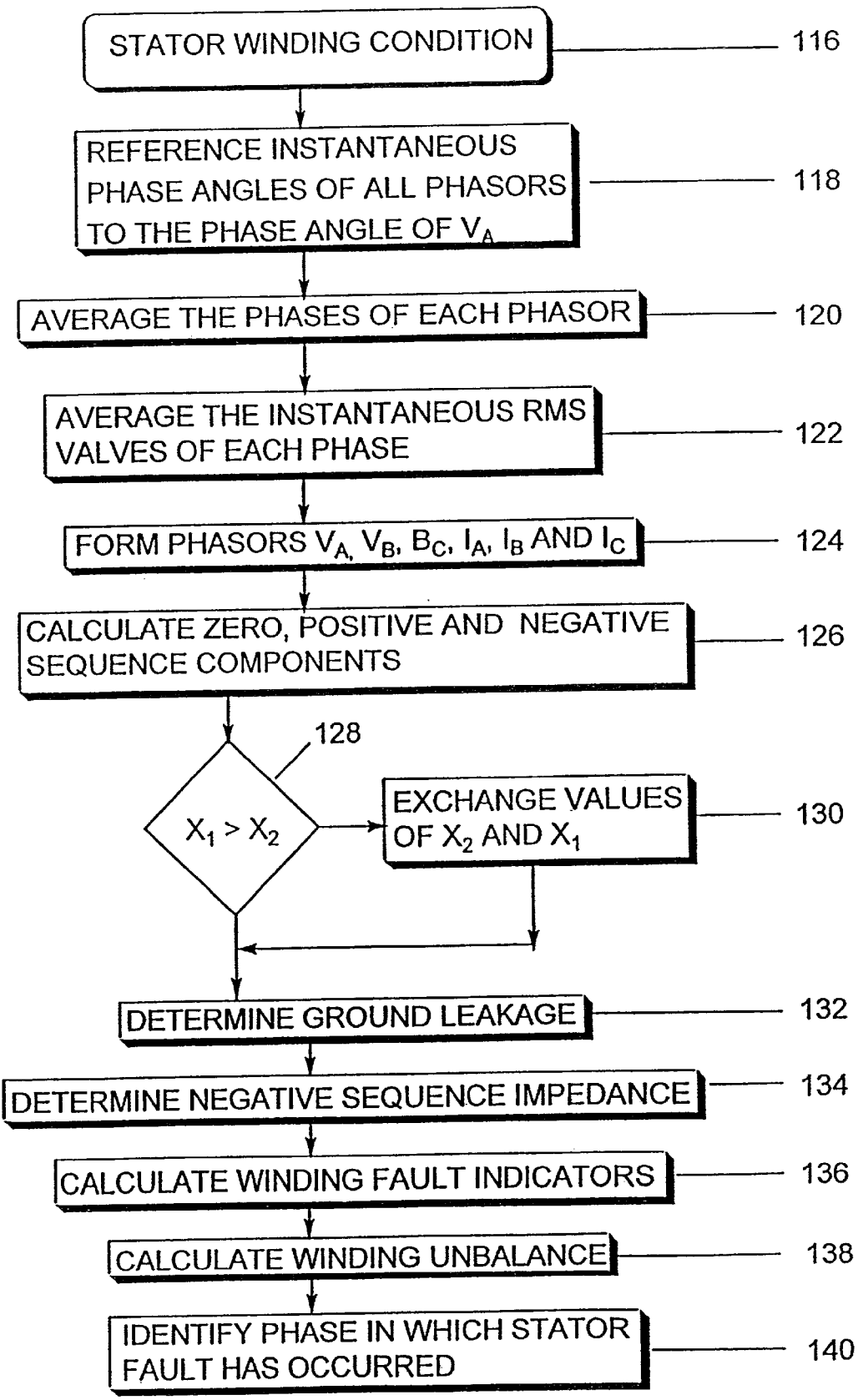
FIG. 6 is a flow diagram of a preferred method of determining stator winding condition in accordance with the system of FIG. 1.

Referring now to FIG. 6, a flow diagram of a preferred method of determining stator winding condition in accordance with the present invention is shown, beginning at step 116. First, at steps 118 to 126, the positive, negative, and zero sequence components are calculated using the instantaneous phasors, which are obtained from an analytic signal representation of the voltage and current signals, from the current and voltage sensors 42–52. At step 118, the instantaneous phase angles of all phasors ($V_a$, $V_b$, $V_c$, $I_a$, $I_b$, $I_c$) are referenced to the phase angle of $V_a$. This is done by subtracting the instantaneous, unwrapped phase of $V_a$ from the likewise instantaneous, unwrapped phases of $V_b$, $V_c$, $I_a$, $I_b$, and $I_c$. $V_a$ then has a zero phase. The other phasors have non-zero but stable (essentially constant) phases.

At step 120, after each phase has been referenced to $V_a$, the phases of each phasor are averaged, in order to reduce noise and at step 122, the instantaneous RMS values of each phase are averaged. At step 124, using the average RMS and average phase angle values calculated in steps 118 to 122, phasors $V_A$, $V_B$, $V_C$, $I_A$, $I_B$, and $I_C$ are formed. At step 126, the zero, positive, and negative sequence components are calculated using the following equations:

$$\begin{bmatrix} V_{A0} \\ V_{A1} \\ V_{A2} \end{bmatrix} = \frac{1}{3} \cdot \begin{bmatrix} 1 & 1 & 1 \\ 1 & a & a^2 \\ 1 & a^2 & a \end{bmatrix} \cdot \begin{bmatrix} V_A \\ V_B \\ V_C \end{bmatrix}, \begin{bmatrix} I_{A0} \\ I_{A1} \\ I_{A2} \end{bmatrix} = \frac{1}{3} \cdot \begin{bmatrix} 1 & 1 & 1 \\ 1 & a & a^2 \\ 1 & a^2 & a \end{bmatrix} \cdot \begin{bmatrix} I_A \\ I_B \\ I_C \end{bmatrix}$$

where $a = e^{j120°}$ $X_0$ = zero sequence component
$X1$ = positive sequence component
$X_2$ = negative sequence component The above formula is valid for motors running in the ABC sequence. The magnitude of $X_1$ will always be greater than $X_2$. If the magnitude of $X_1$ turns out to be less than that of $X_2$, then the values of $X_1$ and $X_2$ are exchanged, and the motor sequence is ACB. Accordingly, at step 128, the value of $X_1$ is compared to the value of $X_2$. If $X_1$ is less than $X_2$, then step 130 is executed, which exchanges the values of $X_1$ and $X_2$. After exchanging the values of $X_1$ and $X_2$, execution continues with step 132. In the case of $X_1$ is not less than $X_2$, then execution proceeds from step 128 directly to step 132, without executing step 130. It is recognized that alternative methods of calculating the negative sequence components can be performed. In the above process, the normal electrical phasors were averaged before transformation to symmetrical components (i.e., zero, positive and negative sequence components). Alternatively, the transformation can be done first on an instantaneous basis so the electrical waveforms are represented as symmetrical component waveforms, which are phase-referenced to one component, and averaged as symmetrical components. In other words, the electrical components can be averaged before or after the symmetrical transformation. Also, it should be recognized that there are other mathematical expressions (such as using individual equations instead of a matrix equation) of the symmetrical transformation which are mathematically equivalent to the equation above. Accordingly, the present invention is not meant to be limited to the preferred method, disclosed above, of calculating the negative sequence component.

At step 132, the ground leakage is calculated. The zero sequence current represents ground leakage because, by Kirchoff's law for currents, the sum of all current paths from a point must be zero. The ground leakage is calculated as the ratio of the zero sequence current RMS to the positive sequence current RMS:

$$\text{Ground leakage } \% = \frac{I_{A0}, \text{rms}}{I_{A1}, \text{rms}} \cdot 100$$

If the ground leakage % is higher than the specified threshold then a stator fault is reported. In the presently preferred embodiment, the ground leakage threshold is set at 5.0%.

At step 134, the effective negative sequence impedance is calculated from the symmetrical components, according to the following equation:

$$Z_{2\mathit{eff}} = \frac{V_{A2}}{V_{A2}}; V_{A2} \text{ and } I_{A2} \text{ are phasors}$$

At step 136, winding fault indicators are determined. The most fruitful way of analyzing the data is to look at both the magnitude and phase (or equivalently, the real and imaginary parts) of the negative sequence impedance because the real and imaginary components of the effective impedance change in the event of a fault, sometimes oppositely and sometimes together. To catch all possible occurrences, the negative sequence reactance ($X_2$) and the negative sequence resistance ($R_2$) are used, which are referenced to the baseline normal situation for the motor 30:

$\Delta X_2 = X_{2,new} - X_{2,baseline}$ $\Delta R_2 = R_{2,new} - R_{2,baseline}$ At step 138, winding unbalance is calculated, based on current unbalance, as: Current unbalance−Voltage unbalance, where voltage unbalance is calculated as the maximum deviation from the mean divided by the mean multiplied by 100 and current unbalance is similarly calculated as the maximum deviation from the mean divided by the mean multiplied by 100. If the calculated winding unbalance is higher than a particular threshold, then a stator fault is reported. In the presently preferred embodiment, if the calculated winding unbalance is greater than approximately 3.0%, than a stator fault is reported. Although a value of 3.0% is specified, an alternative method of establishing thresholds, as opposed to or in addition to using a preestablished value, is to monitor the motor system 30 for a period of time and then setting thresholds based on standard deviation calculations for determining faults.

Unbalance may also be calculated by other methods, such as taking the ratio of the negative sequence to the positive sequence components (and expressing as a percent if desired), and by the difference between the highest and lowest RMS values, divided by the mean RMS value (and multiplied by 100 if desired to be expressed as a percentage).

At step 140, if either of the thresholds identified in steps 136 or 138 was exceeded, a stator fault condition is indicated and the phase in which the stator fault has occurred is determined by calculating the real power in each of the three phases, identifying the two phases with the highest real power consumption, and then identifying the "faulty" phase according to the logic shown in TABLE 1. The real power for each phase is calculated as the RMS current multiplied by the RMS voltage for each phase, multiplied by the power factor, respectively. Note that the sequence (ABC or ACB) was previously determined at step 128.

TABLE 1

| 2 PHASES WITH HIGHEST REAL POWER | PHASE WITH STATOR FAULTS | |
|---|---|---|
| | Sequence ABC | Sequence ACB |
| A & B | B | A |
| B & C | C | B |
| A & C | A | C |

Figure 7:
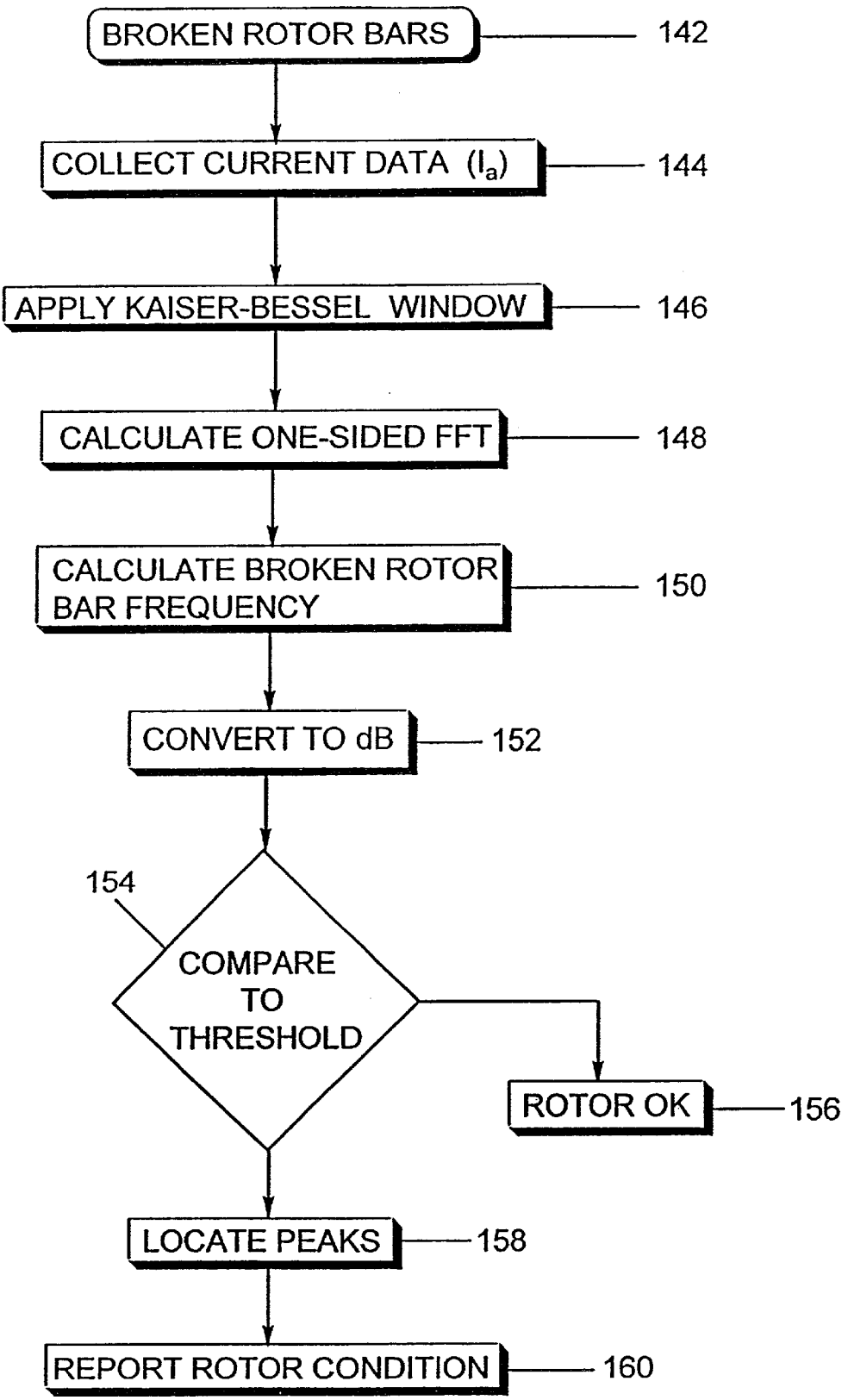
FIG. 7 is a flow diagram of a preferred method of detecting broken rotor bars in accordance with the system of FIG. 1.

Referring now to FIG. 7, broken rotor bars are detected according to the routine beginning at step 142, in the following manner. A broken rotor bar generally results in a reduction in torque in every rotation and has a corresponding effect on each of the three electrical phases. More specifically, the three phases cause three magnetic fields to rotate around at synchronous speed. The rotor rotates around more slowly, differing in speed by a slip frequency. Since each rotor bar rotates through each magnetic field twice, a broken rotor bar (which causes less back EMF than a non-broken rotor bar) effects each phase current at two times the slip frequency. The present state of the art is to examine the spectrum of the current in one phase for side bands separated from the line frequency by two times the slip frequency, and then determining if the amplitude is within approximately 45 dB of the amplitude of the line frequency component. If so, this indicates the presence of one or more broken rotor bars.

At step 144, current $I_a$ data is sampled, using current probe 42, for a predetermined time period, for instance, 16.384 seconds or 32.768 seconds. At step 146, the DC component of the current signal is subtracted out of the data sample. The DC is calculated as the average value of the signal over the 32,768 points. Then, a 32,768 point window is applied by multiplying the 32,768 point signal by an equal length standard FFT window, such as the Hanning or preferably, the Kaiser-Bessel. At step 148, a one sided FFT is calculated. In the presently preferred embodiment, the standard Cooley-Tukey algorithm is used to calculate the one sided FFT and the resulting spectra is divided by N (the number of points). Note that this is the same algorithm as used in step 86 (FIG. 4) in determining shaft frequency.

At step 150, the broken rotor bar frequency is calculated as:

$$f_{BRB} = f_{line} - 2 \cdot s \cdot f_{line}$$

$f_{BRB}$=broken rotor bar frequency, which is the lower twice-slip sideband around line frequency; s is the calculated value of slip. Since the FFT is calculated at discrete frequencies, in general, there is an error in both the amplitude and frequency of the highest line in the-frequency spectrum. These errors depend on the type of FFT window used (i.e., Hanning or Kaiser-Bessel). The corrections used to compensate for these errors are called picket fence corrections. Accordingly, to precisely calculate the magnitude of the broken rotor bar frequency component, a picket fence is applied. The picket fence is modified to look within ±1 spectral line of an estimated peak placement so as not to be interfered with by a strong neighboring synchronous component. Then, the magnitude of the pole-pass sideband is divided by the magnitude of line frequency.

At step 152, apply the following formula to convert to dB:

$$dB = 20 \log\left(\frac{|\text{broken rotor bar frequency}|}{|\text{line frequency}|}\right)$$

At step 154, a comparison is made to a predetermined threshold, in the presently preferred embodiment 45 dB. If the absolute dB value is greater than or equal to the threshold then the rotor is normal, which is reported to the user at step 156. However, if the absolute dB value is less than the threshold, execution proceeds to step 158 to examine the fifth harmonic sidebands. Sidebands around the fundamental frequency can have significant amplitude because of belt transmission and air gap asymmetries, as well as broken rotor bars. Thus the indicator is supplemented by fifth harmonic information. At step 158, the peaks (±1 spectral line) around the following frequencies: $f_{line}$ (5-2·s), $f_{line}$ (5-4·s) and $f_{line}$ (5-6·s) are located. A picket fence is used to calculate the true peak amplitudes and then find the highest peak of the three currents. If the highest peak is within 14 dB of or greater than the fifth harmonic, then the rotor condition is not normal and broken rotor bars are reported to the user at step 160. Typically, within 14 dB indicates broken rotor bars, although this threshold may vary with the type of motor. The threshold may also vary with motor load. Otherwise, there is only a possible problem with the rotor, which is reported to the user at step 160, along with a message giving the user an option to initiate trending. Alternately, the fifth harmonic sideband can be used as the primary detector of broken rotor bars.

The present invention also uses the data signals collected by the current and voltage sensors 42–52 to determine motor efficiency. The present invention compensates for different power sources used for coupled and uncoupled tests by incorporating source unbalance and $I^2R$ line loss ("LineLoss") in its calculations. LineLoss is defined as the $I^2R$ loss in the line from the measurement point (typically a motor control center) to the motor 30:

$$LineLoss = \frac{I_a^2 RL_a + I_b^2 RL_b + I_c^2 RL_c}{1000}$$

where division by 1000 converts Watts to KW. Note, $RL_a$, $RL_b$, and $RL_c$ are individual line resistances, as calculated at step 166. When measurements are taken at the motor, LineLoss is not included in the calculations.

Figure 8:
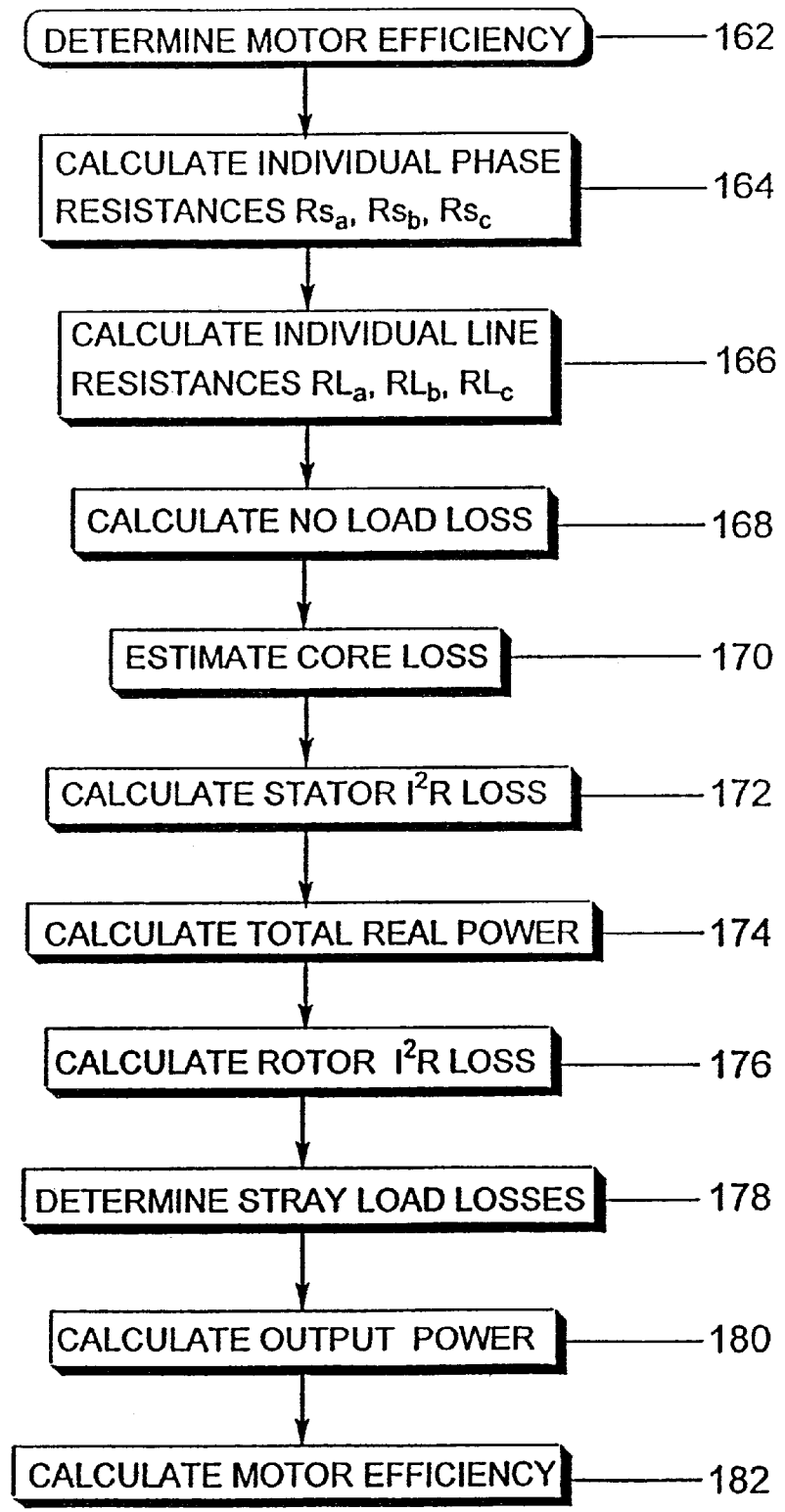
FIG. 8 is a flow diagram of a preferred method of measuring motor efficiency in accordance with the system of FIG. 1.

Referring now to FIG. 8, a method of determining motor efficiency is shown, beginning at step 162, using average phasor RMS values of current and voltage. The first step, indicated at 164, is to calculate individual phase resistances $Rs_a$, $Rs_b$, $Rs_c$ from lead to lead measurements by solving the system: $Rs_a+Rs_b=Rs_{ab}$; $Rs_b+Rs_c=Rs_{bc}$; and $Rs_c+Rs_a=Rs_{ca}$, for the uncoupled and coupled cases. The resistances should be measured as close as possible to the temperature at which the other measurements are made. Similarly, at step 166, the individual line resistances, $RL_a$, $RL_b$, $RL_c$ are also calculated. At step 168, the uncoupled loss is calculated as:

$$Uncoupled\ Loss = P_{un} - \frac{(I_{a,un}^2 Rs_{a,un} + I_{b,un}^2 Rs_{b,un} + I_{c,un}^2 Rs_{c,un})}{1000} - LineLoss_{un} - P_{neg,un}$$

where "un" denotes uncoupled values and $P_{un}$ is the total real power dissipated when the motor is running in the uncoupled condition. Note that all terms are in the same units of KW. $P_{neg}$ is indicative of the power loss due to source unbalance and is calculated as the negative sequence power:

$$P_{neg} = \frac{3 \cdot V_{A2,rms} \cdot I_{A2,rms} \cdot \cos(\theta_{V_{A2}} - \theta_{I_{A2}})}{1000}$$

where $\theta_{V A2}, \theta_{I A2}$ are average negative sequence phase values. The values of V and I used in the above calculations correspond to the operating mode of the motor, i.e., uncoupled or loaded. The negative sequence voltage and current symmetrical components are calculated as follows:

$$V_{A2} = \frac{1}{3} \cdot [1 \quad a^2 \quad a] \cdot \begin{bmatrix} V_A \\ V_B \\ V_C \end{bmatrix}, I_{A2} = \frac{1}{3} \cdot [1 \quad a^2 \quad a] \cdot \begin{bmatrix} I_A \\ I_B \\ I_C \end{bmatrix}$$

At step 170, the core loss (CL) is estimated as percentage, typically 60%, of the fixed losses, as follows:

CL=0.6·Uncoupled Loss

At step 172, the stator $I^2R$ loss is calculated as:

Stator $I^2R$ power loss=$I_a^2 Rs_a + I_b^2 Rs_b + I_c^2 Rs_c$

In this equation and the No Load Loss equation, the Rs value appropriate to the thermal conditions at the time is used. Further, Rs is measured at the motor 30. If Rs is not measured at the motor 30, then lead resistance must be compensated for.

At step 174, total real power is calculated as:

$P_{i,motor} = P_i - \text{LineLoss} - P_{neg}$, where $P_i$ motor is the total real power actually dissipated by the motor, $P_i$ is the Total Real Power measured at that load. At step 176, the rotor $I^2R$ loss is calculated as: rotor $I^2R$ loss=$(P_{i,motor}$-stator $I^2R$ loss-CL)×s. (Note, s is the previously calculated value of slip). At step 178, stray load losses are determined in accordance with standard estimates, as set forth in TABLE 2 (IEEE Standard Test Procedure for Polyphase Induction Motors and Generators, IEEE Std 112-1991):

TABLE 2

ASSUMED VALUES FOR STRAY LOAD LOSS

| Machine Rating | Stray-load loss (% rated output) |
| --- | --- |
| 1–125 hp | 1.8% |
| 126–500 hp | 1.5% |
| 501–2499 hp | 1.2% |
| 2500 hp and greater | 0.9% |

For example, for low hp motors, Stray Losses=0.018 ($P_i$-All Other Losses). Stray Loss=0.018 ($P_i$-Stator Loss-Rotor Loss-Uncoupled Loss) for low hp motors.

At step 180, output power is calculated as: Po=$P_{i,motor}$-uncoupled loss-stator loss-rotor loss-stray loss. At step 182, motor efficiency is calculated as the ratio of output power to input power:

$$\eta = \frac{P_o}{P_{i,motor}}$$

which is also expressed as percent by multiplying the above by 100.

Referring now to FIG. 9, a typical display report 184 of the present invention is shown. The display report 184 is a Condition/Performance Report (CPR) display, including example values. The report 184 can be displayed, for instance, on a CRT connected to the processor 12 or on a CRT connected to a computer or processor to which the data collected and stored by the processor 12 has been downloaded. The report details how the essential condition and performance information can imparted to a user. The CPR display includes important motor diagnostic information which is determined from the data collected by the three current and voltage sensors 42–52, such as the RMS voltage and the RMS current for each phase, the mean RMS voltage, the mean RMS current, along with a percent distortion and percent unbalance calculation. CREST is a ratio of the highest peak to RMS, which is indicative of abnormalities in the shape of the waveform. Motor identification information (not shown), is also included in the report. The CPR display is an example of how essential motor condition and performance information is reported. Typical cases of the condition/performance report are saved so that trending can be performed, as described in more detail below.

The present invention, via software, reduces the volume of data collected by the monitor system 10 (or any online motor monitor system), by first categorizing the data by load. In the preferred embodiment the data is segregated into 5% (of load) intervals. The data within each of these intervals is characterized by a small set of parameters: mean value, standard deviation, skew, kurtosis, max, min, number of observations, and upper and lower confidence limits.

Key statistical information resulting from the above data reduction process is saved and trended, i.e., plotted against time, to determine non-zero slope. While a periodic one-time analysis can detect serious problems for a short time span recorded during motor operation, historical trending can provide advanced warning of impending problems. By recording accurate measurements at different times and plotting the resulting records over time or otherwise automatically searching for trends over time, patterns can be detected that indicate a particular parameter is degrading or changing, indicating an impending fault condition while the motor is still operating within acceptable limits. Thresholds are established and if a trend develops that either crosses the threshold or is approaching a threshold, the user is warned of a developing problem. By using the techniques of the present invention, motor faults are detected when they are too small to be of concern, and trended, so that if getting worse, the point at which an operator will want to take corrective measures can be projected. This allowance for the preplanning of downtime is one of the essential benefits of trending. Also, it helps to ensure that the problem will be corrected before it becomes an operational problem, shortening motor life and perhaps resulting in catastrophic motor failure. Trending is best achieved when the data being reviewed is very accurate. The use of the above-discussed demodulation techniques, correction of phase inaccuracies, correction of probe non-linearity, etc., of the present invention provides a practical way to achieve the required accuracy for proper trend analysis.

Distributions are calculated for a population of each type of motor for each load interval for which there is enough data to make a meaningful comparison. Motors outside of the distribution are identified and highlighted to warn the user of an anomalous, possibly dangerous situation.

As previously discussed, the present invention provides a sensor misplacement check of the current probes 42–46 and, if it is determined that one or more probes 42–46 are misplaced, the present invention will perform an automatic correction. It is assumed that the voltage probes 48–54 are correctly connected. The user can interact and respond to system prompts on the display 20 by way of the keypad 18. Initially, the user is prompted to select a transformer configuration from a list of preselected alternatives, such as wye-wye, wye-delta, or delta-wye. The present invention provides a default configuration for the motor 30, so that the user is not necessarily required to enter any set up information. After the three current probes 42–46 and the three voltage probes 48–52 are connected, a plurality of signal samples are collected, for instance 200 samples from each sensor 42–52. The DC component is eliminated from each data signal and a threshold is defined. In the preferred embodiment, the threshold is defined by requiring that the peak voltage and current in any data signal be at least half the peak voltage or current of the data signal with the greatest peak voltage or current. If the threshold is not met, the system 10 informs the user of a faulty voltage or current connection, as appropriate. Each of the (six) data signals is then band-limited, demodulated, and a phasor for each signal is calculated. The signals are bandlimited by a low pass filter and demodulated by performing a time domain Hilbert demodulation. That is, the analytic signal is formed from the original signal as the real part and the Hilbert transform as the quadrature part. To avoid end effects resulting from filtering and demodulation, the first and last 50 points of the in-phase and quadrature components are eliminated.

The RMS values of all the channels are calculated by calculating the instantaneous magnitudes for all six channels as: sqrt(in_phase$^2$+quadrature$^2$), calculating the mean, and multiplying by 1/sqrt(2). Amplitude and phase corrections are then made based on the selected transformer. The amplitude correction involves multiplication with a scaling factor, and the phase correction involves addition with a constant.

The voltage sequence is also checked. In checking the voltage sequence, it is assumed, by default, that the motor 30 is running in the forward sequence, i.e., ABC. With phase B as the reference, phase A is positive (~+120°), and phase C must be negative (~−120°). If this is not the case, then, the user is alerted by way of a message on the display 20 that a reverse sequence has been detected and given the following options: (i) continue, in the case of a reverse direction motor; or (ii) change the voltage probe connections. If the user chooses to change the voltage probe connections, the processor based system 10 re-checks the sequence.

The system 10 also tests for sensors 42–52 on the same phase. This test compares the phase angles between the three currents, and between the three voltages. The test uses the output of the Hilbert phase demodulation. Whereas the Hilbert routine unambiguously reports the phase angle between −π and π, the calculation of the phase differences is ambiguous, ranging from −2π to +2π. To avoid this ambiguity the Law of Cosines is applied because it returns the smallest angle between two vectors. Two electrical phases are compared at a time. For example, for current phases A and B, the distance between unit vectors A and B is the square root of the sum of the real distance squared and the imaginary distance squared. The angle ∠AB is then be calculated as:

$$\theta_{ia,ib} = \cos^{-1}\left(\frac{a^2 + b^2 - c^2}{2ab}\right)$$

where a=length of vector A
b=length of vector B
c=distance between vectors A and B Since A and B are treated as unit vectors, $$\theta_{ia,ib} = \cos^{-1}\left[\frac{2 - (\cos\theta_{ia} - \cos\theta_{ib})^2 - (\sin\theta_{ia} - \sin\theta_{ib})^2}{2}\right].$$

The procedure is to: (a) select a pair of voltage or current channels (without mixing voltage and current); (b) calculate the minimum difference angle for the central 100 (out of 200) points, using the above formula; (c) calculate the mean of these 100 angles; (d) do so for all three possible voltage pairs and all three current pairs (ab, bc, ca); (e) proceed to test against a threshold. In the presently preferred embodiment, a threshold of 30° is used, although other angles could be used. For example:

if $\theta_{ia,ib}$<30° then fail;
Test if ∠v$_a$v$_b$<30°, ∠v$_b$v$_c$<30°, ∠v$_c$v$_a$<30°, and ∠i$_a$i$_b$<30°, ∠i$_b$i$_c$<30°, ∠i$_c$i$_a$<30°.

If any angle test fails, then the user is alerted that the two probes involved are on the same phase.

Finally, the present invention also tests for switched and reversed probes. The test for switched and reversed probes also uses the output of the Hilbert phase demodulation, with the first and last 50 points eliminated to minimize end effects. Thus, a set of 100 points for each current and voltage channel is used. First, the difference is taken between corresponding current and voltage phase angles at each of the 100 points. The difference angle is expressed unambiguously, that is, the angles are expressed in values between −π and π if working in radians or between −180° and 180° if working in degrees. While the Hilbert routine returns unambiguous angles, the test creates a difference function, and unless pains are taken, the resulting angle is ambiguous.

The switched or reversed probe test first checks that all three (mean) difference angles are between −90 and +90 degrees. In other words, the absolute (mean) difference angle must be less than or equal to 90°(π/2). The rationale for this test is that the phase difference (power factor angle) between a voltage and its corresponding current cannot be greater than 90° for either an induction or synchronous motor (under normal operating conditions; however, it can momentarily exceed 90° during lightly loaded startup).

In order to completely avoid ambiguity in specifying the angle, the real and imaginary parts (cos and sine of the difference angle) are calculated and the test checks the polarity of the mean real component. If the sum or mean of the real values over 100 points is positive, the polarity is OK for that phase. If negative, then the polarity is wrong and the user is sent a message. By using the real part, the ambiguity of specifying the angle is avoided. Symbolically, if $\cos(\overline{\theta}_{ia,va})$<0 then fail If the three power factor angles are less than ±90°, then the switched or reversed probe test next checks to determine if the three (mean) difference angles are within 30° of one another. In symbols: max (difference angle mean)−min (difference angle mean)<=30°. The method for detecting if the three mean difference angles (i.e., power factor angles) are within 30°(π/6) of each other is to calculate the difference angle as the (four quadrant) atan2 (imag/real).

$$\theta_{ia,va} = a\tan2\left[\frac{\sin(\theta_{ia,va})}{\cos(\theta_{ia,va})}\right]$$

There is no ambiguity in the angles because the atan2 function reports angles between −π and π (~180° and +180°), and the range is further reduced to between −π/2 and π/2 (−90° and +90°) because to have gotten this far the configuration must have passed the previous 90° test. Thus (max−min) will give a valid measure of the spread of the three phase angles. A stable measure is then determined by taking the atan2 of the sum or mean imaginary over the sum or mean real and checked, as follows:

if max($\overline{\theta}_{ia,va}$, $\overline{\theta}_{ib,vb}$, $\overline{\theta}_{ic,vc}$)−min($\overline{\theta}_{ia,va}$, $\overline{\theta}_{ib,vb}$, $\overline{\theta}_{ic,vc}$)>30° then fail The threshold is selected to be 30° because this is half way between the ideal case for a balanced system (0°) and the case of switched and reversed probes (60°). Note this 30° test is different than the one which tested for probes on the same phase. The present test checks to make sure the power factor angles on the three electrical phases are approximately equal. The other 30° test checks to make sure the current probe signals are not in phase and that the voltage probe signals are not in phase. If a failure occurs, then the user is given the following options: (i) physically change the probe connections based on a recommendation by the system 10, (ii) ignore the system warning and proceed, or (iii) allow the system 10, via software, to correct for the wrong probe hook-up.

If the user selects the first option, then a two-step procedure is used to recommend changes (it is assumed that the three voltage and current phases are available at this stage). The first step detects whether the probes 42–46 are switched and recommends the correction, irrespective of any probe reversals. There are, in all, six possible probe placement corrections. They are: (i) no switching; (ii) Probes A and B switched; (iii) Probes B and C switched; (iv) Probes C and A switched; (v) Probe A on phase C, Probe B on phase A, and Probe C on phase B; (vi) Probe A on phase B, Probe B on phase C, and Probe C on phase A. Basically, the system 10 checks which of the above six cases of probe placement corrections gives a reasonable power factor angle for all three phases.

For the purpose of display, the following convention is adopted: the instantaneous phase angle of each of the six signals is calculated using voltage phase B (0°) as a reference. The mean phase angle for each signal is calculated with the phase values, for instance, in the 150° to 210° range. The phase angles are represented by the following equation:

if phase>150°, phase=phase−360°;

if phase<−210°, phase=phase+360°.

For example, if the phase angle is +230°, then 230°−360°= 130°; and if the phase angle is −170°, then 170°−210°=190°.

A first step, STEP 1, performs the following calculations:

(a) Calculate the resulting power factor angles for each of the probe placements, denote them as $Ang_x$. The power factor angle is calculated by subtracting the current phase from the voltage phase.

(b) Since probe reversals are also possible, the power factor angles are also calculated for each case assuming that the probes may be reversed. This is done by simply subtracting 180° from $Ang_x$, and denoting them as $rev\_Ang_x$.

For example, if the calculated phases from current probes A, B and C are: $ph\_I_a=50$, $ph\_I_b=-70$, $ph\_I_c=-10$, and the calculated voltage phases are $ph\_V_a=120$, $ph\_V_b=0$, $ph\_V_c=120$, the probe check detects a failure, and when the user selects the first option, the following table is constructed:

TABLE 3

| CASE | $Ang_a$ | $r\_Ang_a$ | $Ang_b$ | $r\_Ang_b$ | $Ang_c$ | $r\_Ang_c$ |
|---|---|---|---|---|---|---|
| I. $ph\_I_a = 50$; $ph\_I_b = -70$; $ph\_I_c = -10$; | 70 | −110 | 70 | −110 | −110 | 70 |
| II. $ph\_I_a = -70$; $ph\_I_b = 50$; $ph\_I_c = -10$; | 190 | 10 | −50 | 130 | −110 | 70 |
| III. $ph\_I_a = 50$; $ph\_I_b = -10$; $ph\_I_c = -70$; | 70 | −110 | 10 | 190 | −50 | 130 |
| IV. $ph\_I_a = -10$; $ph\_I_b = -70$; $ph\_I_c = 50$; | 130 | −50 | 70 | −110 | 190 | 10 |
| V. $ph\_I_a = -10$; $ph\_I_b = 50$; $ph\_I_c = -70$; | 130 | −50 | −50 | 130 | −50 | 130 |
| VI. $ph\_I_a = -70$; $ph\_I_b = -10$; $ph\_I_c = 50$; | 190 | 10 | 10 | 190 | 190 | 10 |

(c) Find the (two) cases which give power factor angles between 0 and 90 degrees for all the three phases, using either $Ang_x$ or $rev\_Ang_x$. (In the above example, cases I and VI satisfy this criterion).

(d) Calculate the total real power of the motor 30 for each of the two cases, as:

Total real power=$V_{a,rms} \cdot I_{a,rms} \cdot PF_a + V_{b,rms} \cdot I_{b,rms} \cdot PF_b + V_{c,rms} \cdot I_{c,rms} \cdot PF_c$ Power Factor, $Pf_x=\cos(Pf\_Ang_x)$; where $Pf\_Ang_x=\min[abs(Ang_x), abs(rev\_Ang_x)]$.

(e) Find the loading condition of the motor for the two cases.

$0.7 \leq Pf_x < 1 \rightarrow$ highly loaded $0.5 \leq Pf_x < 0.7 \rightarrow$ moderately loaded $0 \leq Pf_x < 0.5 \rightarrow$ lightly loaded These are default definitions which may be changed or modified by the user.

(f) The user then has to select between the two cases. The system 10 displays (i) the power factor for all three phases, (ii) RMS current, (iii) the total real power and (iv) loading condition of the motor 30, for both the cases.

(g) Recommend appropriate correction based on the selection.

If the user selects case 1, then the present invention informs the user that the current probes 42–46 are on the right phase, and checks for probe reversals. The probe check then proceeds to STEP 2. For any other case, the present invention recommends the respective correction, such as (case VI): "Place Probe A on phase B, Probe B on phase C, and Probe C on phase A. Do not reverse probes during switching". After the corrections are made, the probe check proceeds to STEP 2.

In STEP 2, the probe test:

(a) resamples the current signals or re-acquires "fresh" data, demodulates the data, and calculates the voltage and current phasors;

(b) calculates $Ang_x$ and $re\_Ang_x$ for the three phases;

(c) recommends correction to the user to reverse the phases for which $abs(rev\_Ang_x) < abs(Ang_x)$.

When the system 10 software makes the changes automatically, STEP 2 is not performed to detect reversals in the current probes 42–46. Rather, the system software remaps the channels and the reversals are picked up directly from the above table (TABLE 3). For example, first, data is remapped as: phase B data→probe A; phase C data→probe B; phase A data→probe C. Then, probes A and C are reversed by inverting the data (multiplication with −1). Note that when remapping is done in the software, calibration data is also carried along with the re-mappings.

The switching and reversing steps are separated when the user makes the probe corrections because when the probes are switched physically, the reversal of the probe is carried along with the same probe, which is not the case with remapping the channels (i.e., switching the probes via software). In other words, switching of two probes (with one of them reversed) physically, and switching the phasors in the software does not always result in the same phase relation between the channels.

Figure 13:
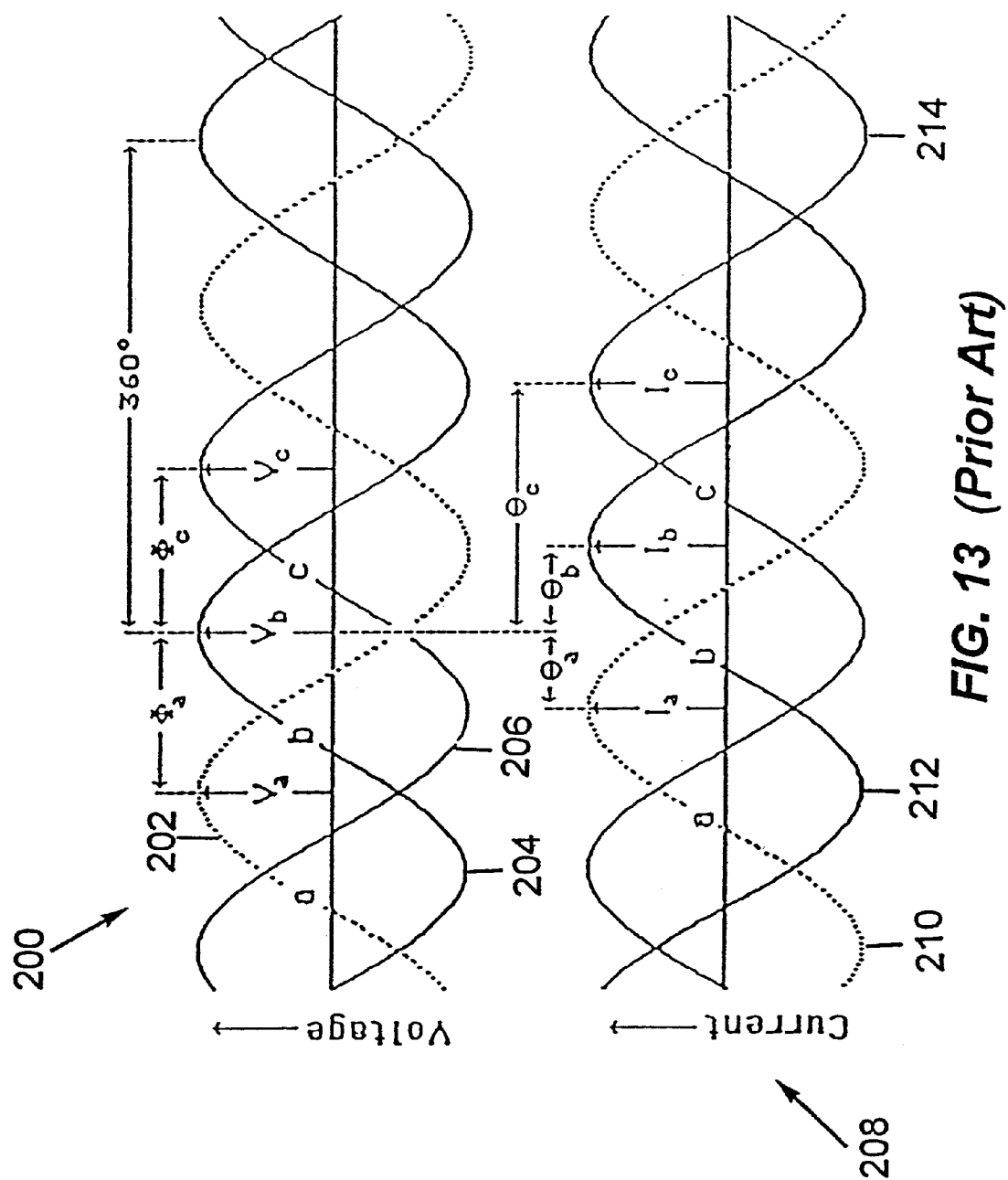
FIG. 13 is a prior art voltage and current waveform diagram.

Traditional phasor diagrams for displaying per-phase voltage and current information comprises either two overlaid or two separate polar (or vector) representations, one for per-phase voltages and one for the per-phase currents. These polar representations are primarily useful for instruction. Unfortunately, such polar representations, do not convey an intuitive feel for the state of the motor or of the phase relationships between the various phase voltages and phase currents in a way that is useful for monitoring purposes because it is difficult for a user to perceive minor amplitude differences among the three current or voltage vectors at their 120° separation. It is equally difficult to visually perceive any small alteration in the 120° angle between similar vectors and differences among the three power factor angles between the three voltage and current pairs. Generally, motor faults have to be gross before they become visually apparent in the traditional vector diagrams. Accordingly, the present invention presents a new method of displaying per-phase voltage and current information using bar diagrams. The bar diagrams of the present invention generally are easier to interpret than the prior art phase diagrams, especially when auditing the installation of probes. Further enhancements to the bar graphs provide additional voltage and current information. For instance, making the bars linear over a narrow range around the mean of the currents or voltages permits enhanced display of voltage and current unbalance and positioning the bars horizontally permits displaying phase relationships. Further advantages will be apparent to those of skill in the art from the description which follows:

Referring now to FIG. 13, the current and voltage waveforms for a three-phase induction motor are shown. The voltage waveform 200 includes the a-phase voltage waveform 202, the b-phase voltage and the c-phase voltage waveform 206. The current waveform 208 shows the a-phase current waveform 210, the b-phase current waveform 212 and the c-phase current 214. FIG. 13 shows a simulated measurement from an induction motor operating at a power factor of 0.85.

Figure 14:
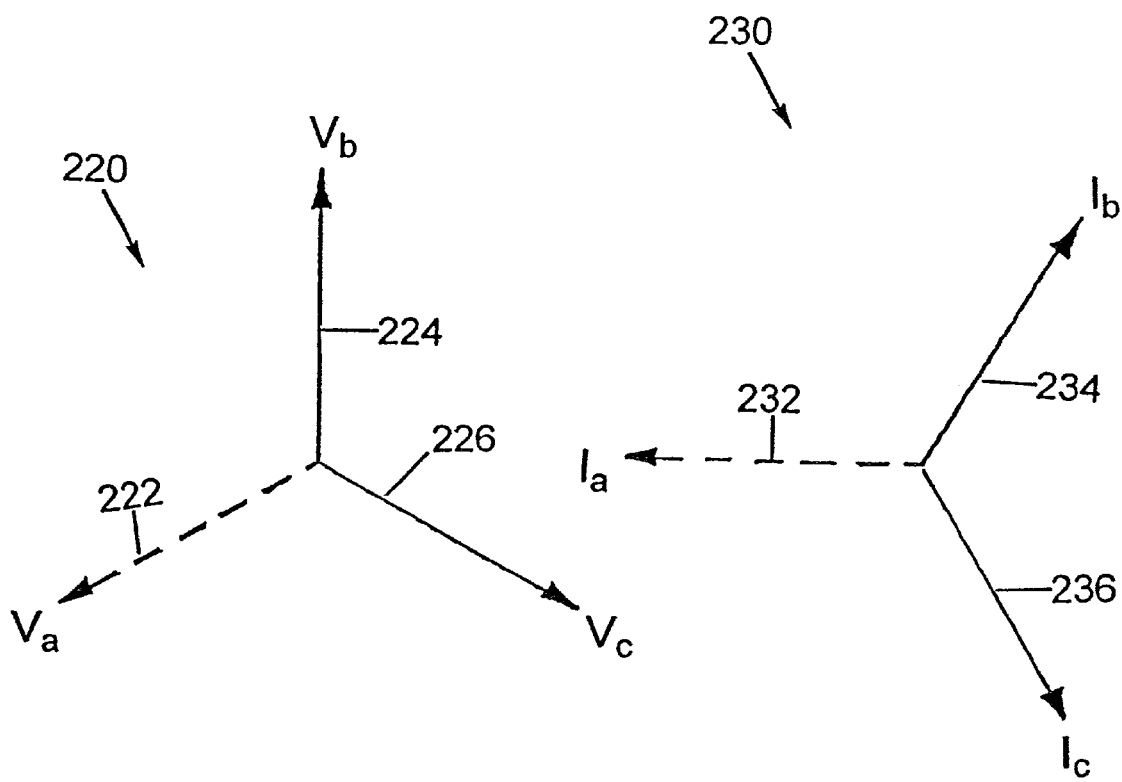
FIG. 14 is a prior art phasor diagram displaying the voltage and current information of FIG. 13.

FIG. 14 is a prior art phasor diagram showing simulated measurements from an induction motor operating at a power factor of 0.85. The voltage phasor diagram 220 includes the a-phase voltage at 222, the b-phase voltage at 224 and the c-phase voltage at 226 and the current phasor diagram 230 shows the a-phase current at 232, the b-phase current at 234 and the c-phase current at 236.

Figure 15:
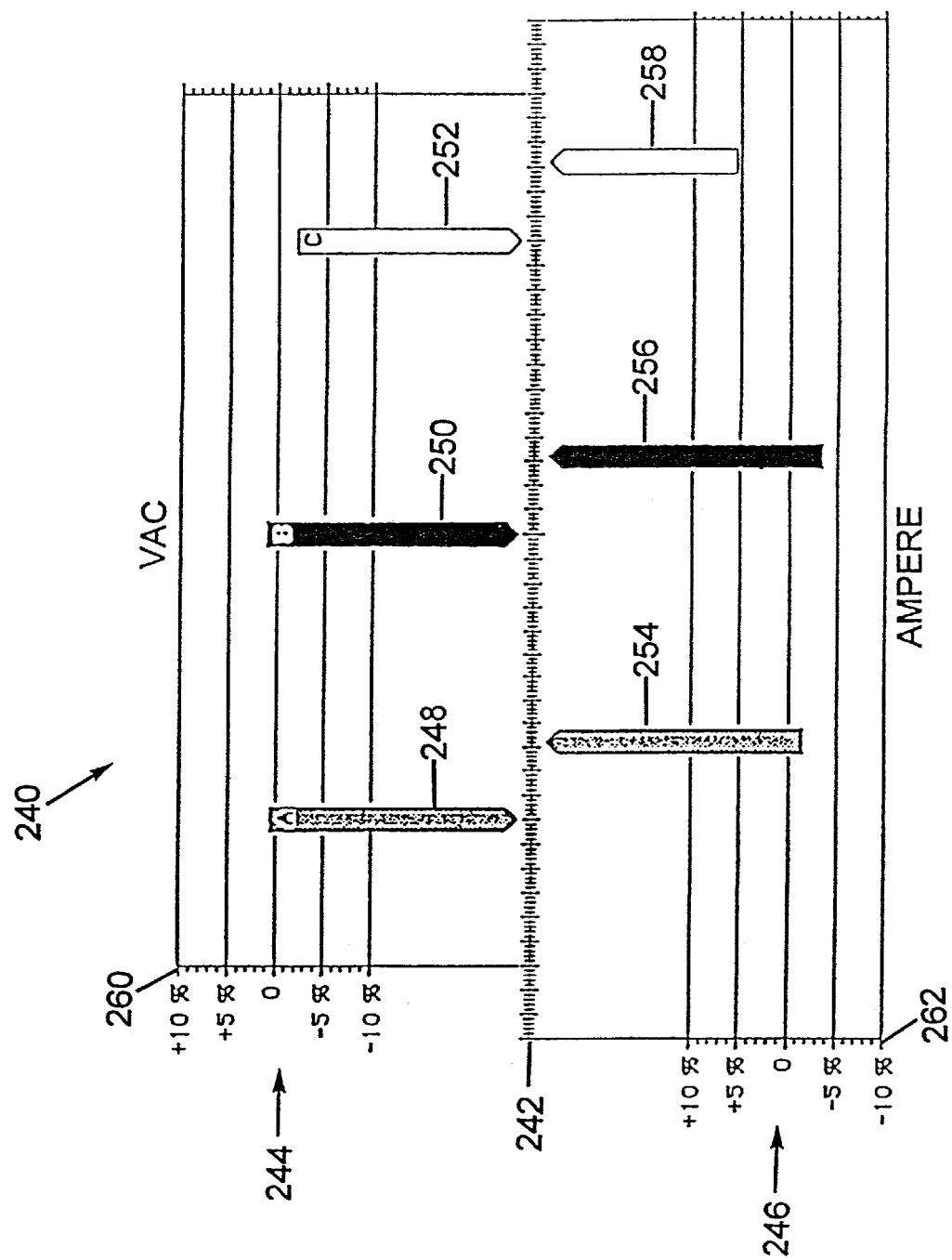
FIG. 15 is a bar diagram in accordance with the present invention displaying the voltage and current information of FIG. 13.

Referring now to FIG. 15, a bar diagram 240 according to the present invention is shown indicating simulated measurements from an induction motor operating at a power factor of 0.5. The bar diagram or bar chart 240 comprises a horizontal axis 242, a first bar chart 244 for plotting phase-to-neutral voltages which graphically represent phase-to-neutral voltages of the motor, and a second bar chart 246 for plotting phase currents which graphically represent phase currents of the motor. The first bar chart 244 shows the a-phase voltage at 248, the b-phase voltage at 250 and the c-phase voltage at 252. The second bar chart 246 shows the a-phase current at 254, the b-phase current at 256 and the c-phase current at 258. In the preferred embodiment, the voltage bar chart 244 is located on a first side of the horizontal axis 242 and the current bar chart 246 is located on a second, opposite side of the horizontal axis 242. In the presently preferred embodiment, the voltage bar chart 244 is located above the horizontal axis 242 and the current bar chart 246 is located below the horizontal axis 242 and the voltage bars 248, 250, 252 and the current bars 254, 256, 258 are positioned along the horizontal axis according to their respective phase angles, such that a power factor angle can be determined directly from the horizontal axis 242. In FIG. 15, a voltage unbalance of about 2% and a current unbalance of approximately 5.5% are shown and are readily determinable by viewing the vertical axes 260, 262 of the voltage bar chart 244 and the current bar chart 246, respectively. The voltage and current vertical axes, 260, 262 are scaled such that unbalance percentages are readily determinable. In order to convey such unbalance information on the phasor diagram, FIG. 14, it would require unconventional (nonlinear) scaling of the vector lengths 222–226 and 232–236. In the bar chart 240, the horizontal axis 242 is scaled to show phase relationships between the per-phase voltages and the per-phase currents. Thus, it can be seen that each of the per-phase currents as represented by bars 254, 256, and 258 trail the per-phase voltages represented by bars 248, 250 and 252, respectively.

Figure 10:
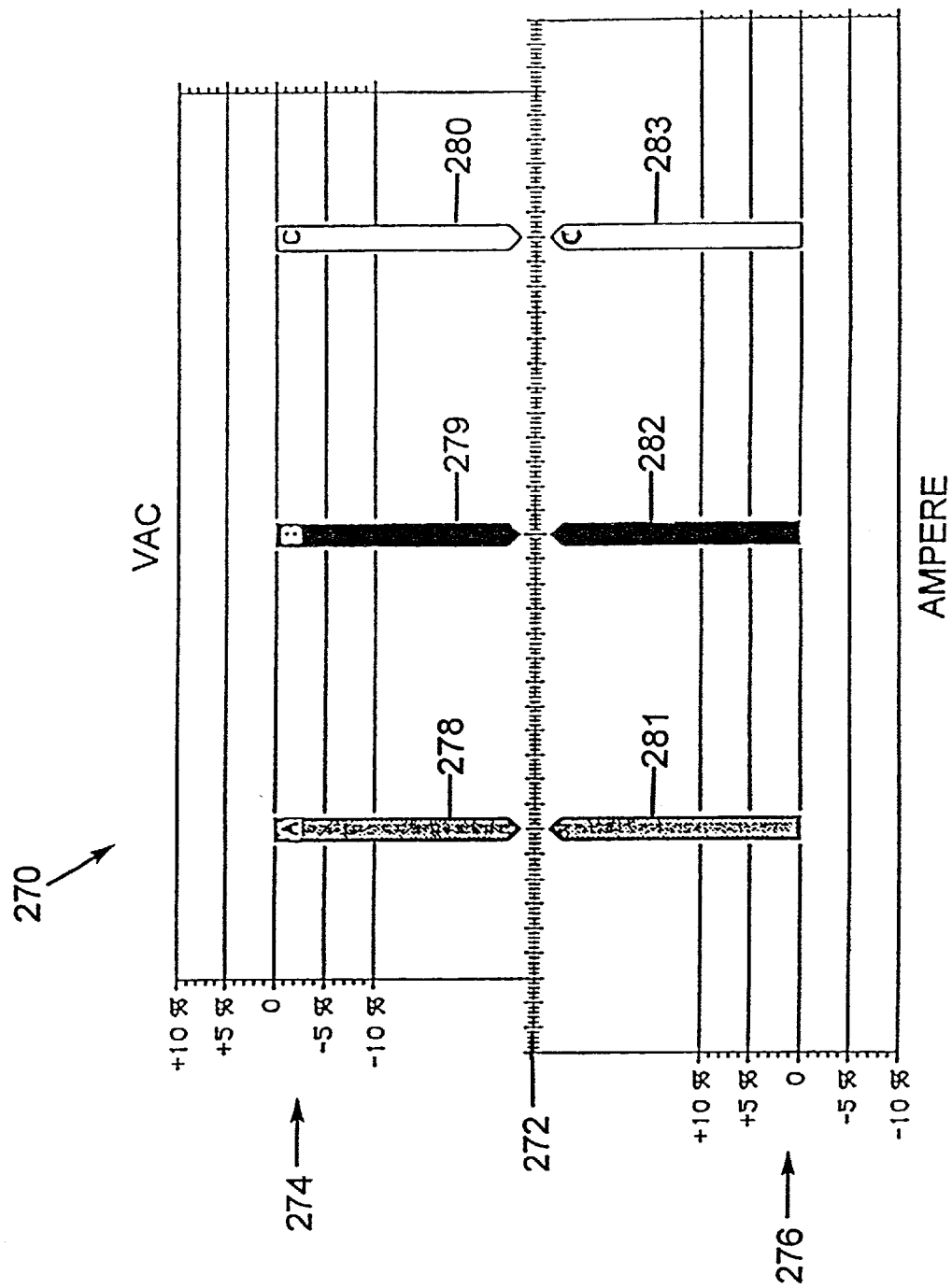
FIG. 10 is a bar diagram for displaying traditional phasor diagram information, in accordance with the present invention.

Referring now to FIG. 10, a phasor bar diagram 270 in accordance with the present invention is shown including a horizontal axis 272, a voltage bar chart 274 and a current bar chart 276. The voltage bar chart 274 and the current bar chart 276 are shown on opposite sides of the horizontal axis 272. The voltage bar chars 274 includes three bars, 278, 279 and 280 which represent the three-phase voltages of a motor and the current bar chart 276 shows current bars 281, 282 and 283 which display the three per-phase currents of the motor. The voltage bar chart 274 is scaled to the average of the three voltages 278, 279, 280 and the bars 278, 279 and 280 are drawn to emphasize a range of ±10% of this average value. The current bars 281, 282, and 283 are identically scaled from the three per-phase currents. In the presently preferred embodiment, color or texture is used to identify and distinguish the respective phases (a, b, and c). The bars 278–283 are horizontally positioned in proportion to their phase angles. In the presently preferred embodiment, voltage phase b represented bar 279 is used as a reference and is thus centered and all other phases are measured from it. In FIG. 10, perfect voltage and current balances an operation at unity power factor is illustrated. The bars for the a and c phases 278, 280 and 281, 283 are 120° away from those of the b-phase markers 279, 282. The horizontal axis 272 spans ±210° away from those of the b-phase markers, 279, 282. The horizontal axis 272 spans ±210° from the b-voltage position 279.

Figure 11:
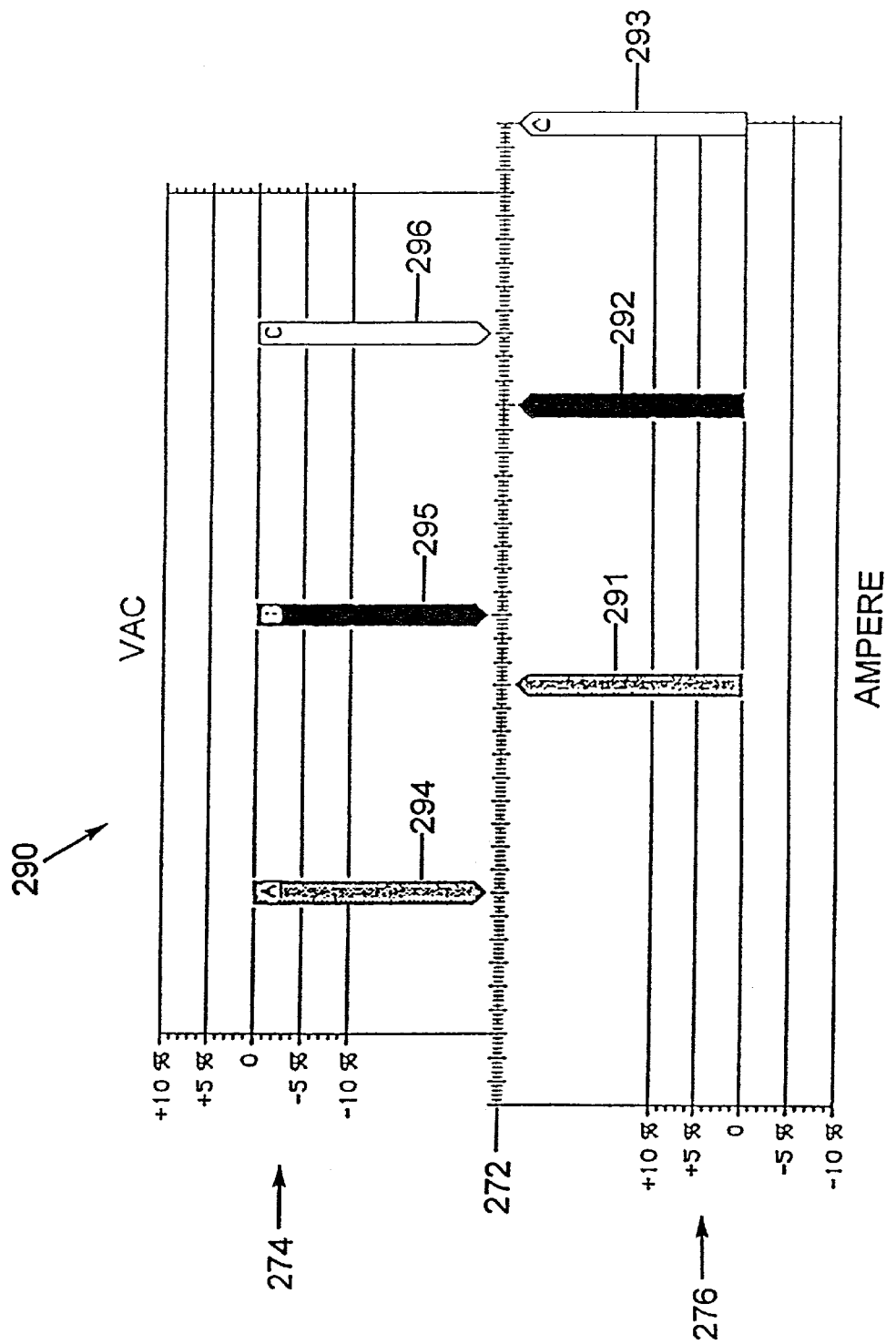
FIG. 11 is a bar diagram for displaying traditional phasor diagram information showing motor operation with a lagging or inductive power factor of zero, in accordance with the present invention.

Referring now to FIG. 11, a phasor bar chart 290 in accordance with the present invention is shown including a voltage bar chart 274, a current bar chart 276 and a horizontal axis 272. FIG. 11 illustrates operation at a lagging or inductive power factor of 0. Note that the current bars 291, 292, 293 are shifted to the right by 90° (the power factor angle). This feature is readily determinable by noting the distance the voltage bars 294, 295, 296 and each of the current bars, 291, 292, and 293, respectively. Note that the current bars 291–293 are shown to the right of the respective voltage bars 294–296, which indicates that the probe setup is correct for the induction motor (a power factor of zero is not realistic for induction motors and represents an extreme case).

Figure 12:
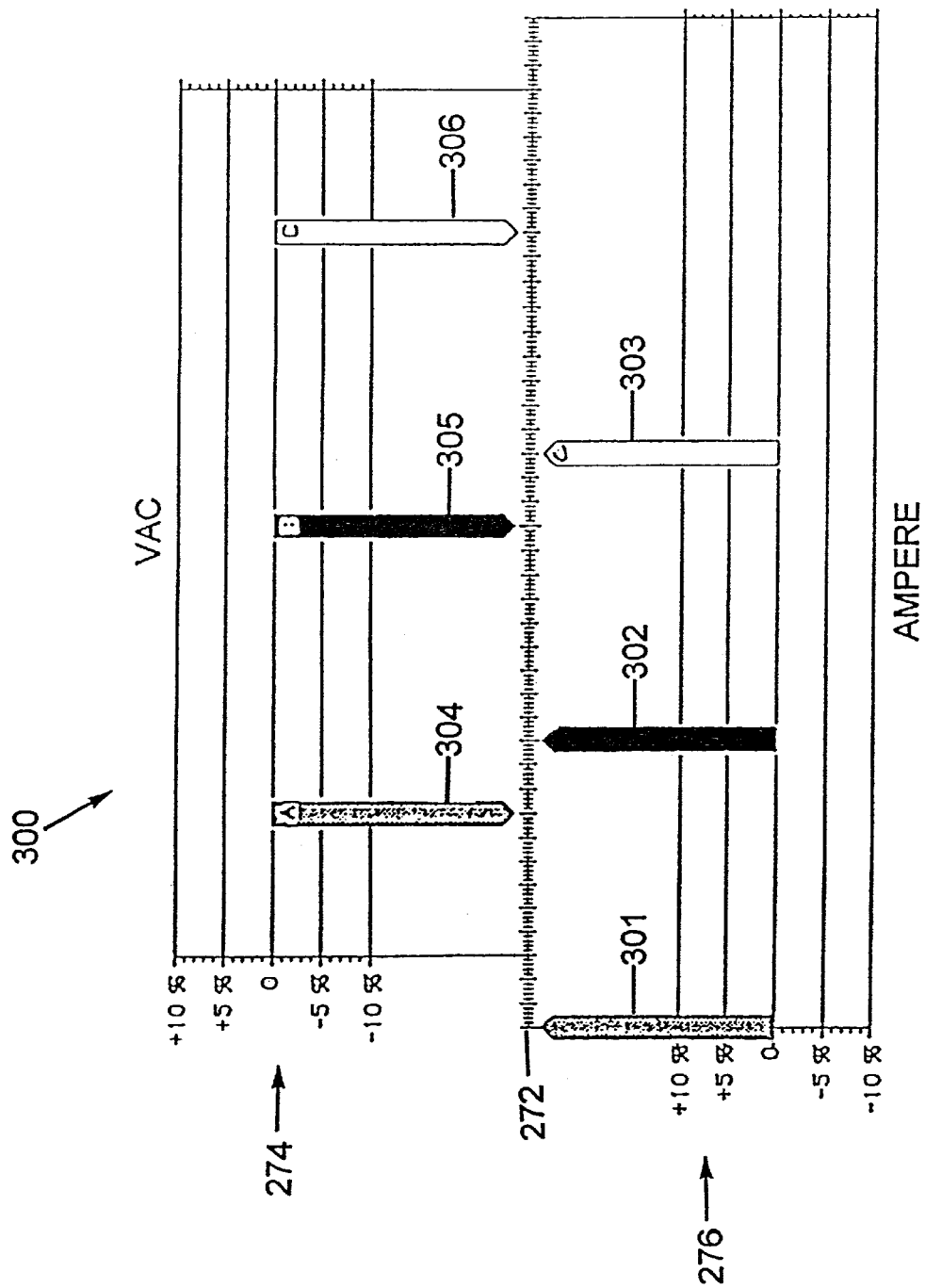
FIG. 12 is a bar diagram for displaying traditional phasor diagram information showing a synchronous motor at zero leading or capacitant power factor, in accordance with the present invention.

Referring now to FIG. 12, a phasor bar 30° in accordance with the present invention is shown illustrating the per-phase voltages and currents of a synchronous motor at 0 leading or capacitant power factor. Such a situation is possible when the motor's rotor is deliberately over-excited at low load. Note that the current bars, 301, 302, 303 appear to the left of the respective voltage bars 304, 305, 306 by a 90° power factor angle.

Referring now to FIGS. 16 and 17, FIG. 16 shows a prior art phasor diagram including a voltage phasor diagram 320 and a current phasor diagram 322 and FIG. 17 of the present invention includes a voltage bar chart 324 and a current bar chart 326 with the bar charts 324, 326 sharing a common horizontal axis 328. FIGS. 16 and 17 illustrate a scenario where the a and b current probes have been inadvertently interchanged. Both FIGS. 16 and 17 illustrate this error by showing inconsistent a, b, c sequencing between the voltage and current diagrams 320, 322 (FIG. 16) and 324, 326 (FIG. 17).

Figure 18:
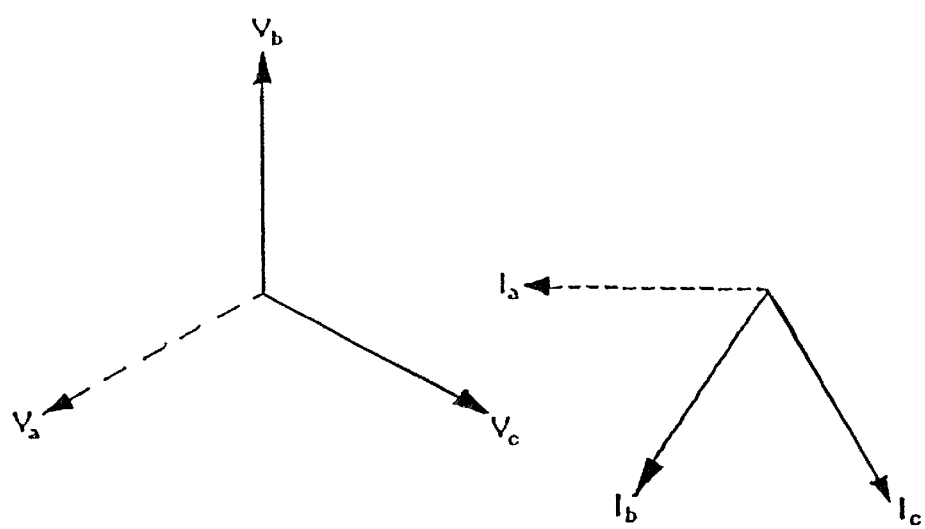
FIG. 18 is prior art phasor diagram illustrating normal phasors with the direction sense of the B current probe being wrong.
Figure 19:
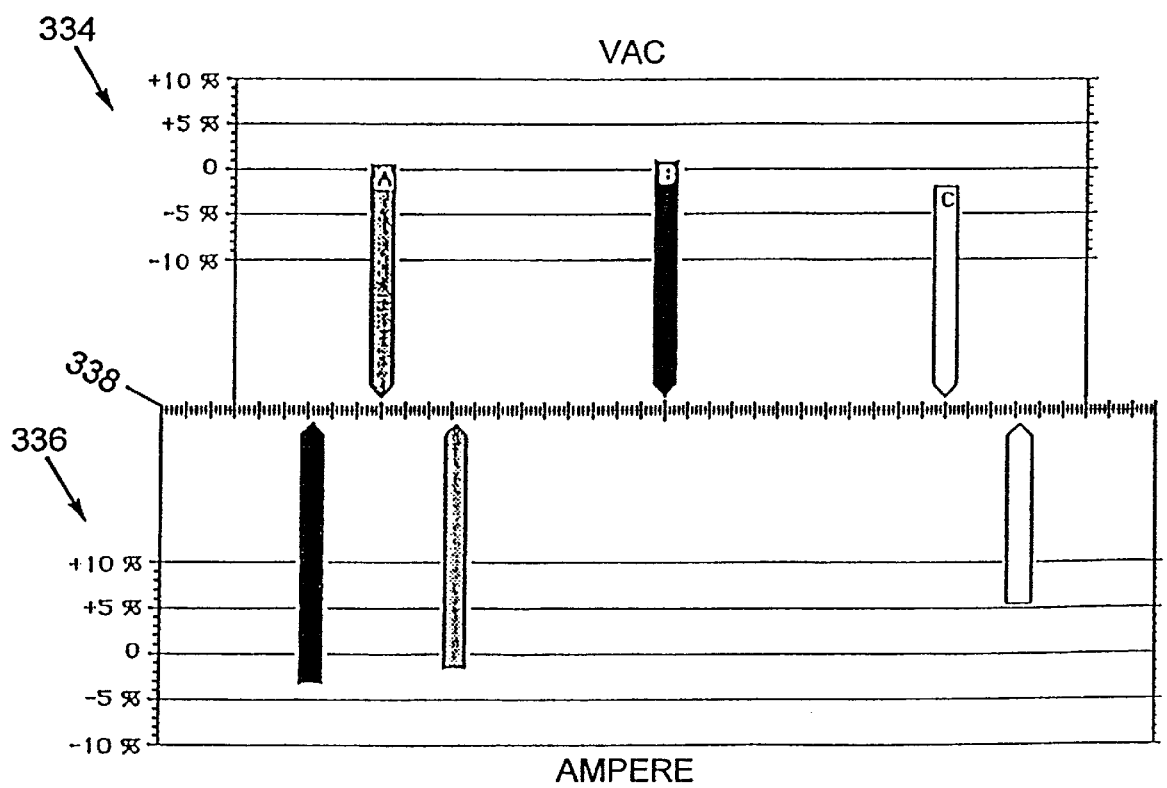
FIG. 19 is a bar diagram in accordance with the present invention displaying the voltage and current information of FIG. 18.

Referring now to FIGS. 18 and 19, respective phasor diagrams (FIG. 18) and phasor bar charts (FIG. 19) are shown which illustrate a probe setup error in which the direction sense of the b current probe is wrong. Both FIGS. 18 and 19 illustrate a 180° phase shift and a greater than ±90° separation between voltage and current for the b phase.

Figure 20:
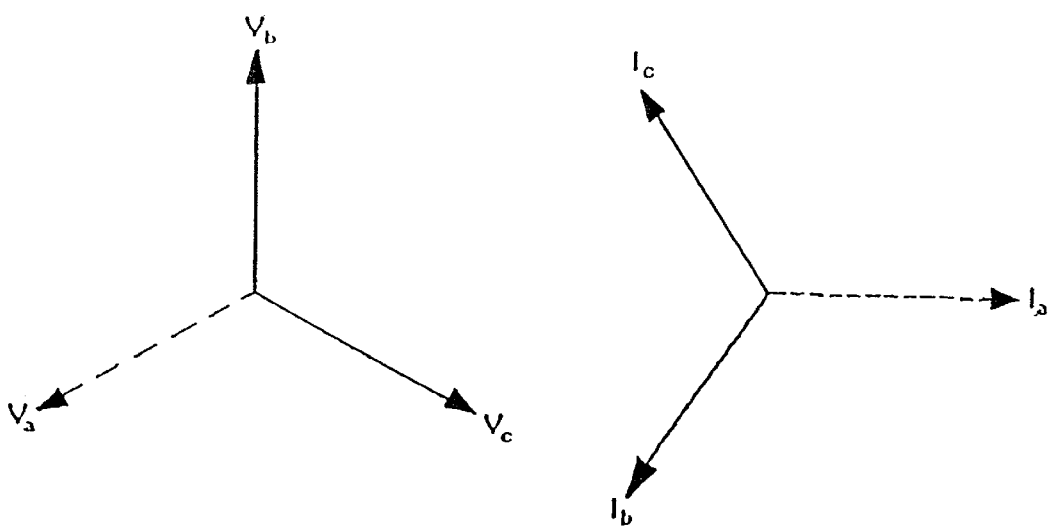
FIG. 20 is prior art phasor diagram illustrating a situation where the A, B and C current probes are reversed in orientation.
Figure 21:
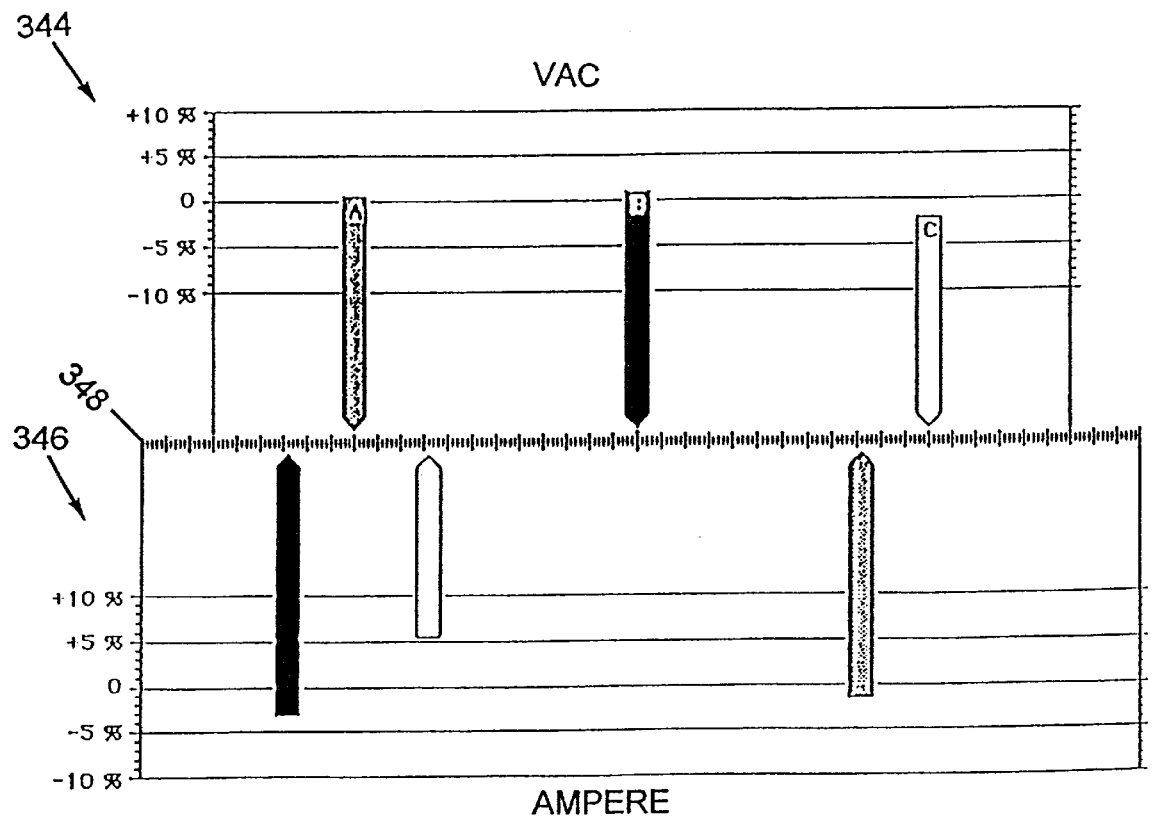
FIG. 21 is a bar diagram in accordance with the present invention displaying the voltage and current information of FIG. 20.

Referring now to FIGS. 20 and 21, prior art phasors diagrams 340, 342 are shown in FIG. 20 and bar charts of the present invention 344, 346 are shown with a common horizontal axis 348 in FIG. 21. Both FIGS. 20 and 21 illustrate a situation in which all three current probes have been installed backwards. Both FIGS. 20 and 21 indicate greater than 90° separation between each respective phase pair. It is believed that the bar diagram representations of the present invention (i.e. FIG. 21) more readily illustrates something is amiss in the probe setup than the prior art voltage and current representations.

The bar diagrams of the present invention are easier in general to interpret than the prior art phasor diagrams, and especially when auditing the installation of probes or sensors. Further enhancements to the bar graphs provide additional voltage and current information. For instance, making the bars nonlinear (but linear over a narrow interval) permits voltage and current unbalance and positioning the bars horizontally with respect to each other permits displaying phase relationships.

From the foregoing description, it can be seen that the present invention comprises an improved method and apparatus for on-line analysis of polyphase electrical motors and their driven machines. It will be appreciated by those skilled in the art that changes could be made to the embodiment described above without departing from the broad inventive concept thereof. It is understood, therefore, that this invention is not limited to the particular embodiment disclosed, but it is intended to cover modifications within the spirit and scope of the present invention as defined by the appended claims.

What is claimed is:

1. A method of identifying broken rotor bars in a polyphase induction motor, the motor including a number of pole pairs, by using an electrical signature of the motor, comprising the steps of:

(a) simultaneously sensing an instantaneous current signal supplied to the motor as a function of time over a period of time for at least one electrical phase of the motor;

(b) performing a Fourier Transform on the sensed current signal over at least a portion of the period of time to provide a current signal spectra;

(c) locating a peak in the current signal spectrum at a fifth harmonic of line frequency;

(d) locating a peak in the current signal spectrum at a fifth harmonic sideband of $f_{line}$ (5-2·s);

(e) locating a peak in the current signal spectrum at a fifth harmonic sideband of $f_{line}$ (5-4·s);

(f) locating a peak of the current signal spectrum at a fifth harmonic sideband of $f_{line}$ (5-6·s);

(g) identifying the sideband peaks having an amplitude within a predetermined value of an amplitude of the located fifth harmonic peak, said identified sideband peaks indicating a broken rotor bar.

2. The method of claim 1 wherein the predetermined value is 14 dB.

3. The method of claim 1 further comprising the step of:

locating peaks of the at least one current phase at a first harmonic of line frequency and a lower sideband thereof at $f_{line}$ (1-2·s) and identifying the first harmonic lower sideband peaks which are within a predetermined value of the located first harmonic peak, whereby steps (a) through (g) are not performed if no first harmonic sideband peaks are within the predetermined value of the located first harmonic peak.

* * * * *